(12) United States Patent
Berkovich et al.

(10) Patent No.: US 12,108,141 B2
(45) Date of Patent: Oct. 1, 2024

(54) DYNAMICALLY PROGRAMMABLE IMAGE SENSOR

(71) Applicant: Meta Platforms Technologies, LLC, Menlo Park, CA (US)

(72) Inventors: Andrew Samuel Berkovich, Bellevue, WA (US); Reid Pinkham, Redmond, WA (US); Tanner Schmidt, Seattle, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 267 days.

(21) Appl. No.: 16/983,863

(22) Filed: Aug. 3, 2020

(65) Prior Publication Data

US 2021/0044742 A1    Feb. 11, 2021

Related U.S. Application Data

(60) Provisional application No. 62/883,014, filed on Aug. 5, 2019.

(51) Int. Cl.
*H04N 23/617* (2023.01)
*G06N 3/02* (2006.01)
(Continued)

(52) U.S. Cl.
CPC ............. *H04N 23/617* (2023.01); *G06N 3/02* (2013.01); *H01L 27/14634* (2013.01);
(Continued)

(58) Field of Classification Search
CPC ........... H04N 5/23225; H04N 5/23227; H04N 5/23229; H04N 5/3454; H04N 5/23218;
(Continued)

(56) References Cited

U.S. PATENT DOCUMENTS 4,121,896 A    10/1978    Shepherd
6,384,905 B1    5/2002    Barrows
(Continued)

FOREIGN PATENT DOCUMENTS

CN    102665049 A    9/2012
CN    103207716 A    7/2013
(Continued)

OTHER PUBLICATIONS

U.S. Appl. No. 16/715,792, "Notice of Allowance", Apr. 16, 2021, 10 pages.
(Continued)

*Primary Examiner* — Albert H Cutler
(74) *Attorney, Agent, or Firm* — Kilpatrick Townsend & Stockton LLP

(57) ABSTRACT

In one example, an apparatus comprises a pixel cell array and a controller formed within a semiconductor package. The pixel cell array is configured to: generate, at a first time and based on first programming signals received from the controller, a first image frame; transmit the first image frame to a host processor; and transmit the first image frame or a second image frame to the controller, the second image frame being generated at the first time and having a different sparsity of pixels from the first image frame. The controller is configured to receive second programming signals from a host processor, the second programming signals being determined by the host processor based on the first image frame; update the first programming signals based on the second programming signals; and control the pixel cell array to generate a subsequent image frame based on the updated first programming signals.

20 Claims, 22 Drawing Sheets

(51) Int. Cl.
*H01L 27/146* (2006.01)
*H04N 23/60* (2023.01)
*H04N 23/80* (2023.01)
*H04N 25/443* (2023.01)

(52) U.S. Cl.
CPC ..... *H01L 27/14636* (2013.01); *H04N 23/665* (2023.01); *H04N 23/80* (2023.01); *H04N 25/443* (2023.01)

(58) Field of Classification Search
CPC ........ H04N 5/379; H04N 5/351; H04N 5/341; H04N 5/369; H04N 5/343; H04N 5/345; H04N 5/3456; H04N 25/42; H04N 25/44; H04N 25/441; H04N 25/443; H04N 25/445; G06N 3/02; G06N 3/0454; G06N 3/084; H01L 27/14634; H01L 27/14636
See application file for complete search history.

(56) References Cited

U.S. PATENT DOCUMENTS

| | | |
|---|---|---|
| 6,853,579 B1 | 2/2005 | Chou |
| 7,359,275 B1 | 4/2008 | Wu |
| 7,362,355 B1 | 4/2008 | Yang et al. |
| 7,659,925 B2 | 2/2010 | Krymski |
| 7,920,409 B1 | 4/2011 | Clark et al. |
| 7,956,914 B2 | 6/2011 | Xu |
| 7,969,759 B1 | 6/2011 | Thummalapally et al. |
| 8,134,623 B2 | 3/2012 | Purcell et al. |
| 8,441,535 B2* | 5/2013 | Morin .................... H04N 5/345 382/104 |
| 8,675,110 B2 | 3/2014 | Hirai et al. |
| 8,779,346 B2 | 7/2014 | Fowler et al. |
| 9,094,629 B2 | 7/2015 | Ishibashi |
| 9,210,330 B2 | 12/2015 | Seo |
| 9,282,264 B2 | 3/2016 | Park et al. |
| 9,363,454 B2 | 6/2016 | Ito et al. |
| 9,560,296 B2 | 1/2017 | Hseih et al. |
| 9,646,681 B1 | 5/2017 | Jung et al. |
| 9,723,233 B2 | 8/2017 | Grauer et al. |
| 9,743,024 B2 | 8/2017 | Tyrrell et al. |
| 9,826,175 B2 | 11/2017 | Isobe |
| 9,832,370 B2 | 11/2017 | Cho et al. |
| 9,912,885 B2 | 3/2018 | Isobe |
| 9,955,091 B1 | 4/2018 | Dai et al. |
| 10,007,350 B1 | 6/2018 | Holz et al. |
| 10,090,342 B1 | 10/2018 | Gambino et al. |
| 10,096,631 B2 | 10/2018 | Ishizu |
| 10,154,221 B2 | 12/2018 | Ogino et al. |
| 10,157,951 B2 | 12/2018 | Kim et al. |
| 10,274,730 B2 | 4/2019 | Jepsen et al. |
| 10,321,081 B2 | 6/2019 | Watanabe et al. |
| 10,345,447 B1 | 7/2019 | Hicks |
| 10,484,628 B2 | 11/2019 | Zhang et al. |
| 10,515,284 B2 | 12/2019 | Gousev et al. |
| 10,594,974 B2 | 3/2020 | Ivarsson et al. |
| 10,607,413 B1 | 3/2020 | Marcolina et al. |
| 10,715,824 B2 | 7/2020 | Tall et al. |
| 10,726,627 B2 | 7/2020 | Liu |
| 10,867,655 B1 | 12/2020 | Harms et al. |
| 10,897,586 B2 | 1/2021 | Liu et al. |
| 10,915,995 B2 | 2/2021 | Moloney |
| 10,939,062 B2 | 3/2021 | Ogawa et al. |
| 10,970,619 B1 | 4/2021 | Xiao et al. |
| 10,984,235 B2 | 4/2021 | Gousev et al. |
| 10,999,539 B2 | 5/2021 | Wendel et al. |
| 11,057,581 B2 | 7/2021 | Liu |
| 11,126,497 B2 | 9/2021 | Oh et al. |
| 11,204,835 B2 | 12/2021 | Lu et al. |
| 11,568,609 B1 | 1/2023 | Liu et al. |
| 11,630,724 B2 | 4/2023 | Shin et al. |
| 11,825,228 B2 | 11/2023 | Berkovich et al. |
| 11,888,002 B2 | 1/2024 | Berkovich et al. |
| 11,910,114 B2 | 2/2024 | Berkovich |
| 2002/0113886 A1 | 8/2002 | Hynecek |
| 2003/0005231 A1 | 1/2003 | Ooi et al. |
| 2003/0020100 A1 | 1/2003 | Guidash |
| 2005/0057389 A1 | 3/2005 | Krymski |
| 2005/0058773 A1 | 3/2005 | Hasei et al. |
| 2005/0073874 A1 | 4/2005 | Chan et al. |
| 2005/0237380 A1 | 10/2005 | Kakii et al. |
| 2006/0224792 A1 | 10/2006 | Ooi |
| 2007/0076109 A1 | 4/2007 | Krymski |
| 2007/0222881 A1 | 9/2007 | Mentzer |
| 2008/0007731 A1 | 1/2008 | Botchway et al. |
| 2008/0055736 A1 | 3/2008 | Tsuji et al. |
| 2008/0226170 A1 | 9/2008 | Sonoda |
| 2009/0033588 A1 | 2/2009 | Kajita et al. |
| 2009/0245637 A1* | 10/2009 | Barman ................ G06V 10/25 382/173 |
| 2010/0182468 A1 | 7/2010 | Posch et al. |
| 2010/0194956 A1 | 8/2010 | Yuan et al. |
| 2010/0197821 A1 | 8/2010 | Jeong et al. |
| 2010/0197876 A1 | 8/2010 | Lyu et al. |
| 2010/0245600 A1 | 9/2010 | Chang et al. |
| 2010/0276572 A1 | 11/2010 | Iwabuchi et al. |
| 2011/0055461 A1 | 3/2011 | Steiner et al. |
| 2011/0075470 A1 | 3/2011 | Liaw |
| 2011/0155892 A1 | 6/2011 | Neter et al. |
| 2011/0254986 A1 | 10/2011 | Nishimura et al. |
| 2011/0267362 A1 | 11/2011 | Handschy et al. |
| 2012/0002459 A1 | 1/2012 | Rimondi et al. |
| 2012/0002460 A1 | 1/2012 | Rimondi et al. |
| 2012/0044399 A1* | 2/2012 | Hirai ..................... H04N 25/44 348/E5.022 |
| 2012/0086082 A1 | 4/2012 | Malinge et al. |
| 2012/0105475 A1 | 5/2012 | Tseng |
| 2012/0105668 A1 | 5/2012 | Velarde et al. |
| 2012/0113119 A1 | 5/2012 | Massie |
| 2012/0133807 A1 | 5/2012 | Wu et al. |
| 2012/0161088 A1 | 6/2012 | Choi et al. |
| 2012/0198312 A1 | 8/2012 | Kankani et al. |
| 2012/0200499 A1 | 8/2012 | Osterhout et al. |
| 2012/0212465 A1 | 8/2012 | White et al. |
| 2012/0240007 A1 | 9/2012 | Barndt et al. |
| 2012/0262616 A1 | 10/2012 | Sa et al. |
| 2013/0056809 A1 | 3/2013 | Mao et al. |
| 2013/0057742 A1 | 3/2013 | Nakamura et al. |
| 2013/0068929 A1 | 3/2013 | Solhusvik et al. |
| 2013/0069787 A1 | 3/2013 | Petrou |
| 2013/0120642 A1* | 5/2013 | Kim ..................... H04N 23/635 348/E5.045 |
| 2013/0141619 A1 | 6/2013 | Lim et al. |
| 2013/0185609 A1 | 7/2013 | Park et al. |
| 2013/0187027 A1 | 7/2013 | Qiao et al. |
| 2013/0198577 A1 | 8/2013 | Oh et al. |
| 2013/0207219 A1 | 8/2013 | Ahn |
| 2013/0215290 A1 | 8/2013 | Solhusvik et al. |
| 2013/0293753 A1* | 11/2013 | Keelan .............. H01L 27/14636 348/302 |
| 2013/0299674 A1 | 11/2013 | Fowler et al. |
| 2013/0300009 A1 | 11/2013 | Oganesian et al. |
| 2013/0314591 A1 | 11/2013 | Eromaki |
| 2013/0326116 A1 | 12/2013 | Goss et al. |
| 2014/0042299 A1 | 2/2014 | Wan et al. |
| 2014/0055635 A1 | 2/2014 | Seo |
| 2014/0063250 A1* | 3/2014 | Park ....................... H04N 7/181 348/148 |
| 2014/0170345 A1 | 6/2014 | Aoshima et al. |
| 2014/0247382 A1 | 9/2014 | Moldovan et al. |
| 2014/0368687 A1 | 12/2014 | Yu et al. |
| 2015/0050479 A1 | 2/2015 | Nakamura et al. |
| 2015/0050480 A1 | 2/2015 | Suzuki et al. |
| 2015/0085134 A1 | 3/2015 | Novotny et al. |
| 2015/0158259 A1 | 6/2015 | Yamamoto et al. |
| 2015/0189209 A1 | 7/2015 | Yang et al. |
| 2015/0201142 A1 | 7/2015 | Smith et al. |
| 2015/0222827 A1 | 8/2015 | Isobe |
| 2015/0229859 A1 | 8/2015 | Guidash et al. |
| 2015/0279884 A1 | 10/2015 | Kusumoto |
| 2015/0309311 A1 | 10/2015 | Cho |
| 2015/0309316 A1 | 10/2015 | Osterhout et al. |
| 2015/0312502 A1 | 10/2015 | Borremans |

(56) References Cited

U.S. PATENT DOCUMENTS

| | | |
|---|---|---|
| 2015/0358571 A1 | 12/2015 | Dominguez Castro et al. |
| 2015/0381911 A1 | 12/2015 | Shen et al. |
| 2016/0011422 A1 | 1/2016 | Thurber et al. |
| 2016/0018645 A1 | 1/2016 | Haddick et al. |
| 2016/0021302 A1* | 1/2016 | Cho ............... A61B 5/0037 348/349 |
| 2016/0028974 A1 | 1/2016 | Guidash et al. |
| 2016/0032074 A1 | 2/2016 | Aizenberg et al. |
| 2016/0048964 A1 | 2/2016 | Kruglick |
| 2016/0078614 A1 | 3/2016 | Ryu et al. |
| 2016/0088253 A1 | 3/2016 | Tezuka |
| 2016/0100115 A1 | 4/2016 | Kusano |
| 2016/0105656 A1* | 4/2016 | Lin ................. H04N 23/71 348/223.1 |
| 2016/0117829 A1* | 4/2016 | Yoon ................ G06T 7/50 348/222.1 |
| 2016/0165160 A1 | 6/2016 | Hseih et al. |
| 2016/0210785 A1 | 7/2016 | Balachandreswaran et al. |
| 2016/0256039 A1* | 9/2016 | Fukunaga ............. H04N 23/12 |
| 2016/0295148 A1 | 10/2016 | Lin et al. |
| 2016/0344965 A1 | 11/2016 | Grauer et al. |
| 2016/0360127 A1 | 12/2016 | Dierickx et al. |
| 2017/0039906 A1 | 2/2017 | Jepsen |
| 2017/0041571 A1 | 2/2017 | Tyrrell et al. |
| 2017/0117310 A1 | 4/2017 | Tatani et al. |
| 2017/0154909 A1 | 6/2017 | Ishizu |
| 2017/0161579 A1 | 6/2017 | Gousev et al. |
| 2017/0228345 A1 | 8/2017 | Gupta et al. |
| 2017/0248789 A1 | 8/2017 | Yokoyama |
| 2017/0270664 A1 | 9/2017 | Hoogi et al. |
| 2017/0272768 A1 | 9/2017 | Tall et al. |
| 2017/0280031 A1 | 9/2017 | Price et al. |
| 2017/0293799 A1 | 10/2017 | Skogo et al. |
| 2017/0307887 A1 | 10/2017 | Stenberg et al. |
| 2017/0310910 A1 | 10/2017 | Smith et al. |
| 2017/0338262 A1 | 11/2017 | Hirata |
| 2017/0339327 A1 | 11/2017 | Koshkin et al. |
| 2018/0027174 A1* | 1/2018 | Sengoku ........... H04N 5/23245 348/207.11 |
| 2018/0115725 A1 | 4/2018 | Zhang et al. |
| 2018/0136471 A1 | 5/2018 | Miller et al. |
| 2018/0143701 A1 | 5/2018 | Suh et al. |
| 2018/0167575 A1 | 6/2018 | Watanabe et al. |
| 2018/0176545 A1 | 6/2018 | Aflaki Beni |
| 2018/0204867 A1 | 7/2018 | Kim et al. |
| 2018/0211582 A1 | 7/2018 | Sakariya et al. |
| 2018/0224658 A1 | 8/2018 | Teller |
| 2018/0239108 A1 | 8/2018 | Ishii et al. |
| 2018/0241953 A1 | 8/2018 | Johnson |
| 2018/0252857 A1 | 9/2018 | Glik et al. |
| 2018/0270436 A1 | 9/2018 | Ivarsson et al. |
| 2018/0276841 A1 | 9/2018 | Krishnaswamy et al. |
| 2018/0284594 A1 | 10/2018 | Gao |
| 2018/0288344 A1 | 10/2018 | Chu et al. |
| 2019/0019023 A1 | 1/2019 | Konttori et al. |
| 2019/0027454 A1 | 1/2019 | Chen et al. |
| 2019/0035154 A1 | 1/2019 | Liu |
| 2019/0046044 A1 | 2/2019 | Tzvieli et al. |
| 2019/0098232 A1 | 3/2019 | Mori et al. |
| 2019/0110039 A1 | 4/2019 | Linde et al. |
| 2019/0123088 A1* | 4/2019 | Kwon ............... H01L 27/14634 |
| 2019/0149751 A1 | 5/2019 | Wise |
| 2019/0172227 A1 | 6/2019 | Kasahara |
| 2019/0191116 A1 | 6/2019 | Madurawe |
| 2019/0199946 A1 | 6/2019 | Wendel et al. |
| 2019/0204527 A1 | 7/2019 | Nakajima |
| 2019/0246036 A1 | 8/2019 | Wu et al. |
| 2019/0253650 A1 | 8/2019 | Kim |
| 2019/0307313 A1 | 10/2019 | Wade |
| 2019/0331914 A1 | 10/2019 | Lee et al. |
| 2019/0361250 A1 | 11/2019 | Lanman et al. |
| 2019/0363118 A1 | 11/2019 | Berkovich et al. |
| 2020/0035661 A1 | 1/2020 | Yu et al. |
| 2020/0053299 A1 | 2/2020 | Zhang et al. |
| 2020/0098096 A1 | 3/2020 | Moloney |
| 2020/0193206 A1 | 6/2020 | Turkelson et al. |
| 2020/0195828 A1 | 6/2020 | Reyserhove et al. |
| 2020/0195875 A1 | 6/2020 | Berkovich et al. |
| 2020/0228740 A1 | 7/2020 | Otaka |
| 2020/0273784 A1 | 8/2020 | Mallik et al. |
| 2020/0280689 A1 | 9/2020 | Takahashi et al. |
| 2021/0026796 A1 | 1/2021 | Graif et al. |
| 2021/0075982 A1 | 3/2021 | Wojciechowski et al. |
| 2021/0084249 A1 | 3/2021 | Nakazawa et al. |
| 2021/0110187 A1 | 4/2021 | Pillai et al. |
| 2021/0118847 A1 | 4/2021 | Chuang et al. |
| 2021/0142086 A1 | 5/2021 | Berkovich et al. |
| 2021/0144326 A1 | 5/2021 | Sato et al. |
| 2021/0152758 A1 | 5/2021 | Muraoka |
| 2021/0185199 A1 | 6/2021 | Schneider, Jr. et al. |
| 2021/0185264 A1 | 6/2021 | Wong et al. |
| 2021/0227159 A1 | 7/2021 | Sambonsugi |
| 2021/0264679 A1 | 8/2021 | Liu et al. |
| 2021/0281794 A1 | 9/2021 | Yoda |
| 2021/0283871 A1 | 9/2021 | Lee et al. |
| 2021/0289156 A1 | 9/2021 | Hanzawa et al. |
| 2021/0306586 A1 | 9/2021 | Yamamoto et al. |
| 2021/0337148 A1 | 10/2021 | Powell |
| 2021/0368124 A1 | 11/2021 | Berkovich et al. |
| 2021/0377496 A1 | 12/2021 | Kim et al. |
| 2021/0409625 A1 | 12/2021 | Zhu et al. |
| 2022/0021833 A1 | 1/2022 | Berkovich |
| 2022/0076726 A1 | 3/2022 | Hulton et al. |
| 2023/0239582 A1 | 7/2023 | Berkovich et al. |

FOREIGN PATENT DOCUMENTS

| | | |
|---|---|---|
| CN | 103907133 A | 7/2014 |
| CN | 104204904 A | 12/2014 |
| CN | 106233188 A | 12/2016 |
| CN | 106255978 A | 12/2016 |
| CN | 106791504 A | 5/2017 |
| CN | 107005641 A | 8/2017 |
| CN | 108139799 A | 6/2018 |
| CN | 109298528 A | 2/2019 |
| DE | 102015122055 A1 | 6/2017 |
| EP | 0775591 A2 | 5/1997 |
| EP | 1603170 A1 | 12/2005 |
| EP | 1746820 A1 | 1/2007 |
| EP | 1788802 A1 | 5/2007 |
| EP | 2037505 A1 | 3/2009 |
| EP | 2228846 A1 | 9/2010 |
| EP | 2330173 A2 | 6/2011 |
| EP | 2357679 A2 | 8/2011 |
| EP | 2804074 A2 | 11/2014 |
| EP | 3229457 A1 | 10/2017 |
| EP | 3595296 A1 | 1/2020 |
| EP | 3833005 A1 | 6/2021 |
| JP | 2003319262 A | 11/2003 |
| JP | 2005129139 A | 5/2005 |
| JP | 2006113139 A | 4/2006 |
| JP | 2006348085 A | 12/2006 |
| JP | 2008270500 A | 11/2008 |
| JP | 2013043383 A | 3/2013 |
| JP | 2014531820 A | 11/2014 |
| JP | 2017060155 A | 3/2017 |
| KR | 20110100974 A | 9/2011 |
| WO | 2006022077 A1 | 3/2006 |
| WO | 2014055391 A2 | 4/2014 |
| WO | 2016042734 A1 | 3/2016 |
| WO | 2016088840 A1 | 6/2016 |
| WO | 2016095057 A1 | 6/2016 |
| WO | 2017003477 A1 | 1/2017 |
| WO | 2017013806 A1 | 1/2017 |
| WO | 2017047010 A1 | 3/2017 |
| WO | 2018163554 A1 | 9/2018 |
| WO | 2018231962 A1 | 12/2018 |
| WO | 2019018084 A1 | 1/2019 |
| WO | 2019111528 A1 | 6/2019 |
| WO | 2019145578 A1 | 8/2019 |

(56) References Cited

FOREIGN PATENT DOCUMENTS

| WO | 2019178060 A1 | 9/2019 |
|---|---|---|
| WO | 2019244142 A2 | 12/2019 |
| WO | 2020077283 A1 | 4/2020 |

OTHER PUBLICATIONS

PCT/US2020/044807, "International Search Report and Written Opinion", Sep. 30, 2020, 12 pages.
PCT/US2020/059636, "International Search Report and Written Opinion", Feb. 11, 2021, 18 pages.
Corrected Notice of Allowance mailed Mar. 22, 2022 for U.S. Appl. No. 16/716,050, filed Dec. 16, 2019, 2 Pages.
Invitation to Pay Additional Fees and Where Applicable, Protest Fee for International Application No. PCT/US2021/041775, Oct. 8, 2021, 12 pages.
Non-Final Office Action mailed Mar. 2, 2022 for U.S. Appl. No. 17/127,670, filed Dec. 18, 2020, 18 pages.
Notice of Allowance mailed Feb. 7, 2022 for U.S. Appl. No. 17/324,803, filed May 19, 2021, 8 pages.
Notice of Allowance mailed Mar. 7, 2022 for U.S. Appl. No. 16/421,441, filed May 23, 2019, 18 pages.
Notice of Allowance mailed Mar. 11, 2022 for U.S. Appl. No. 16/716,050, filed Dec. 16, 2019, 13 pages.
Notice of Allowance mailed Jun. 17, 2022 for U.S. Appl. No. 16/715,792, filed Dec. 16, 2019, 2 pages.
Notice of Allowance mailed Jun. 2, 2022 for U.S. Appl. No. 16/716,050, filed Dec. 16, 2019, 13 pages.
Notice of Allowance mailed Apr. 20, 2022 for U.S. Appl. No. 17/083,920, filed Oct. 29, 2020, 06 pages.
Notice of Allowance mailed May 23, 2022 for U.S. Appl. No. 17/324,803, filed May 19, 2021, 9 pages.
Notice of Allowance mailed Jun. 24, 2022 for U.S. Appl. No. 16/421,441, filed May 23, 2019, 17 pages.
Notice of Allowance mailed May 24, 2022 for U.S. Appl. No. 16/715,792, filed Dec. 16, 2019, 9 pages.
Notice of Allowance mailed Jun. 3, 2022 for U.S. Appl. No. 17/324,803, filed May 19, 2021, 6 pages.
Office Action mailed Apr. 5, 2022 for European Patent Application No. 19731047.7, filed May 24, 2019, 7 pages.
Office Action mailed Aug. 11, 2022 for European Patent Application No. 19731047.7, filed May 24, 2019, 10 pages.
Notice of Allowance mailed Sep. 2, 2022 for U.S. Appl. No. 16/715,792, filed Dec. 16, 2019, 9 pages.
Notice of Allowance mailed Sep. 6, 2022 for U.S. Appl. No. 16/421,441, filed May 23, 2019, 17 pages.
Notice of Allowance mailed Sep. 8, 2022 for U.S. Appl. No. 17/324,803, filed May 19, 2021, 8 pages.
Notice of Allowance mailed Sep. 9, 2022 for U.S. Appl. No. 17/083,920, filed Oct. 29, 2020, 10 pages.
Notice of Allowance mailed Sep. 9, 2022 for U.S. Appl. No. 17/091,331, filed Nov. 6, 2020, 2 pages.
Notice of Allowance mailed Sep. 19, 2022 for U.S. Appl. No. 16/716,050, filed Dec. 16, 2019, 13 pages.
Notice of Allowance mailed Aug. 24, 2022 for U.S. Appl. No. 17/091,331, filed Nov. 6, 2020, 9 pages.
Office Action mailed Aug. 17, 2022 for Chinese Application No. 201980083991.5, filed Jun. 17, 2021, 24 pages.
Office Action mailed Jul. 29, 2022 for Taiwan Application No. 108118209, filed May 27, 2019, 15 pages.
U.S. Appl. No. 16/715,792, "Notice of Allowance", Aug. 25, 2021, 9 pages.
U.S. Appl. No. 17/083,920, "Advisory Action", Oct. 1, 2021, 4 pages.
PCT/US2021/033321, "International Search Report and Written Opinion", Sep. 6, 2021, 11 pages.
U.S. Appl. No. 16/715,792, "Non-Final Office Action", Jan. 1, 2021, 15 pages.

Amir M.F., et al., "3-D Stacked Image Sensor With Deep Neural Network Computation," IEEE Sensors Journal, IEEE Service Center, New York, NY, US, May 15, 2018, vol. 18 (10), pp. 4187-4199, XP011681876.
Cho K., et al., "A Low Power Dual CDS for a Column-Parallel CMOS Image Sensor," Journal of Semiconductor Technology and Science, Dec. 30, 2012, vol. 12 (4), pp. 388-396.
Chuxi L., et al., "A Memristor-Based Processing-in-Memory Architechture for Deep Convolutional Neural Networks Approximate Computation," Journal of Computer Research and Development, Jun. 30, 2017, vol. 54 (6), pp. 1367-1380.
Corrected Notice of Allowability mailed Apr. 9, 2021 for U.S. Appl. No. 16/255,528, filed Jan. 23, 2019, 5 Pages.
Extended European Search Report for European Application No. 18179846.3, mailed Dec. 7, 2018, 10 Pages.
Extended European Search Report for European Application No. 18179851.3, mailed Dec. 7, 2018, 8 Pages.
Extended European Search Report for European Application No. 19743908.6, mailed Sep. 30, 2020, 9 Pages.
Final Office Action mailed Oct. 18, 2021 for U.S. Appl. No. 16/716,050, filed Dec. 16, 2019, 18 Pages.
Final Office Action mailed Oct. 21, 2021 for U.S. Appl. No. 16/421,441, filed May 23, 2019, 23 Pages.
Final Office Action mailed Jan. 27, 2021 for U.S. Appl. No. 16/255,528, filed Jan. 23, 2019, 31 Pages.
International Search Report and Written Opinion for International Application No. PCT/US2018/039350, mailed Nov. 15, 2018, 11 Pages.
International Search Report and Written Opinion for International Application No. PCT/US2018/039352, mailed Oct. 26, 2018, 8 Pages.
International Search Report and Written Opinion for International Application No. PCT/US2018/039431, mailed Nov. 7, 2018, 12 Pages.
International Search Report and Written Opinion for International Application No. PCT/US2020/058097, mailed Feb. 12, 2021, 09 Pages.
International Search Report and Written Opinion for International Application No. PCT/US2021/031201, mailed Aug. 2, 2021, 13 Pages.
International Search Report and Written Opinion for International Application No. PCT/US2021/033321, mailed Sep. 6, 2021, 11 pages.
Millet L., et al., "A 5500-Frames/s 85-GOPS/W 3-D Stacked BSI Vision Chip Based on Parallel In-Focal-Plane Acquisition and Processing," IEEE Journal of Solid-State Circuits, USA, Apr. 1, 2019, vol. 54 (4), pp. 1096-1105, XP011716786.
Non-Final Office Action mailed Sep. 2, 2021 for U.S. Appl. No. 16/910,844, filed Jun. 24, 2020, 7 Pages.
Non-Final Office Action mailed Jul. 10, 2020 for U.S. Appl. No. 16/255,528, filed Jan. 23, 2019, 27 Pages.
Non-Final Office Action mailed Oct. 21, 2021 for U.S. Appl. No. 17/083,920, filed Oct. 29, 2020, 19 Pages.
Non-Final Office Action mailed Nov. 23, 2018 for U.S. Appl. No. 15/847,517, filed Dec. 19, 2017, 21 Pages.
Non-Final Office Action mailed Jul. 25, 2019 for U.S. Appl. No. 15/909,162, filed Mar. 1, 2018, 20 Pages.
Notice of Allowance mailed Apr. 1, 2021 for U.S. Appl. No. 16/255,528, filed Jan. 23, 2019, 7 Pages.
Notice of Allowance mailed Mar. 18, 2020 for U.S. Appl. No. 15/909,162, filed Mar. 1, 2018, 9 Pages.
Notice of Allowance mailed Dec. 22, 2021 for U.S. Appl. No. 16/910,844, filed Jun. 24, 2020, 7 pages.
Notice of Allowance mailed Nov. 24, 2021 for U.S. Appl. No. 16/910,844, filed Jun. 24, 2020, 8 pages.
Notice of Allowance mailed Aug. 25, 2021 for U.S. Appl. No. 16/715,792, filed Dec. 16, 2019, 9 Pages.
Office Action mailed Jul. 3, 2020 for Chinese Application No. 201810821296, filed Jul. 24, 2018, 17 Pages.
Office Action mailed Mar. 9, 2021 for Chinese Application No. 201810821296, filed Jul. 24, 2018, 10 Pages.
Office Action mailed Jun. 28, 2020 for Chinese Application No. 201810821296, filed Jul. 24, 2018, 2 Pages.

(56) References Cited

OTHER PUBLICATIONS

Partial European Search Report for European Application No. 18179838.0, mailed Dec. 5, 2018, 13 Pages.
Restriction Requirement mailed Feb. 2, 2021 for U.S. Appl. No. 16/716,050, filed Dec. 16, 2019, 7 Pages.
Sebastian A., et al., "Memory Devices and Applications for In-memory Computing," Nature Nanotechnology, Nature Publication Group, Inc, London, Mar. 30, 2020, vol. 15 (7), pp. 529-544, XP037194929.
Shi C., et al., "A 1000fps Vision Chip Based on a Dynamically Reconfigurable Hybrid Architecture Comprising a PE Array and Self-Organizing Map Neural Network," International Solid-State Circuits Conference, Session 7, Image Sensors, Feb. 10, 2014, pp. 128-130, XP055826878.
International Preliminary Report on Patentability for International Application No. PCT/US2020/044807, mailed Feb. 17, 2022, 10 pages.
Notice of Allowance mailed Feb. 14, 2022 for U.S. Appl. No. 16/715,792, filed Dec. 16, 2019, 9 pages.
Notice of Allowance mailed Feb. 22, 2022 for U.S. Appl. No. 17/083,920, filed Oct. 29, 2020, 10 pages.
U.S. Appl. No. 16/421,441, "Non-Final Office Action", May 7, 2021, 17 pages.
U.S. Appl. No. 16/716,050, "Non-Final Office Action", May 14, 2021, 16 pages.
U.S. Appl. No. 17/083,920, "Final Office Action", Jul. 28, 2021, 19 pages.
U.S. Appl. No. 17/083,920, "Non-Final Office Action", Apr. 21, 2021, 17 pages.
PCT/US2019/034007, "International Search Report and Written Opinion", Oct. 28, 2019, 19 pages.
PCT/US2019/066805, "International Search Report and Written Opinion", Mar. 6, 2020, 13 pages.
PCT/US2019/066831, "International Search Report and Written Opinion", Feb. 27, 2020, 15 pages.
Final Office Action mailed Oct. 6, 2022 for U.S. Appl. No. 17/127,670, filed Dec. 18, 2020, 20 pages.
International Search Report and Written Opinion for International Application No. PCT/US2022/034259, mailed Oct. 21, 2022, 10 pages.
Non-Final Office Action mailed Feb. 2, 2023 for U.S. Appl. No. 17/469,258, filed Sep. 8, 2021, 17 pages.
Non-Final Office Action mailed Mar. 6, 2023 for U.S. Appl. No. 17/992,648, filed Nov. 22, 2022, 24 pages.
Notice of Allowance mailed Jan. 3, 2023 for U.S. Appl. No. 16/421,441, filed May 23, 2019, 11 pages.
Notice of Allowance mailed Jan. 3, 2023 for U.S. Appl. No. 16/715,792, filed Dec. 16, 2019, 9 pages.
Notice of Allowance mailed Feb. 7, 2023 for U.S. Appl. No. 17/083,920, filed Oct. 29, 2020, 10 pages.
Notice of Allowance mailed Feb. 8, 2023 for U.S. Appl. No. 17/324,803, filed May 19, 2021, 8 pages.
Notice of Allowance mailed Dec. 15, 2022 for U.S. Appl. No. 17/091,331, filed Nov. 6, 2020, 8 pages.
Notice of Allowance mailed Jan. 26, 2023 for U.S. Appl. No. 16/716,050, filed Dec. 16, 2019, 14 pages.
Office Action mailed Feb. 11, 2023 for Chinese Application No. 201980048866.0, filed May 24, 2019, 20 Pages.
Office Action mailed Feb. 13, 2023 for Taiwan Application No. 108146255, filed Dec. 17, 2019, 30 pages.
Amir M.F., et al., "NeuroSensor: A 3D Image Sensor with Integrated Neural Accelerator," IEEE SOI-3D-Subthreshold Microelectronics Technology Unified Conference (S3S), Oct. 2016, pp. 1-2.
Corrected Notice of Allowance mailed Apr. 18, 2023 for U.S. Appl. No. 17/127,670, filed Mar. 5, 2021, 2 pages.
Devlin N.R., et al., "Patterning Decomposable Polynorbornene with Electron Beam Lithography to Create Nanochannels," Journal of Vacuum Science and Technology, vol. 27, No. 6, Dec. 1, 2009, pp. 2508-2511.
Dong J., et al., "Self-Assembly of Highly Stable Zirconium(IV) Coordination Cages with Aggregation Induced Emission Molecular Rotors for Live-Cell Imaging," Angewandte Chemie International Edition, vol. 59, No. 25, Jun. 15, 2020, 10 pages.
Final Office Action mailed Sep. 25, 2023 for U.S. Appl. No. 17/469,258, filed Sep. 8, 2021, 17 pages.
International Preliminary Report on Patentability for International Application No. PCT/US2020/058439, mailed Jun. 23, 2022, 11 pages.
International Preliminary Report on Patentability for International Application No. PCT/US2020/059560, mailed Jun. 16, 2022, 8 pages.
International Preliminary Report on Patentability for International Application No. PCT/US2020/061218, mailed Jun. 9, 2022, 9 pages.
International Preliminary Report on Patentability for International Application No. PCT/US2020/062991, mailed Jul. 7, 2022, 8 pages.
International Preliminary Report on Patentability for International Application No. PCT/US2020/066992, mailed Jul. 7, 2022, 27 pages.
International Preliminary Report on Patentability for International Application No. PCT/US2021/014970, mailed Sep. 9, 2022, 7 pages.
International Preliminary Report on Patentability for International Application No. PCT/US2021/016158, mailed Aug. 18, 2022, 7 pages.
International Search Report and Written Opinion for International Application No. PCT/US2020/056758, mailed Feb. 17, 2021, 11 Pages.
International Search Report and Written Opinion for International Application No. PCT/US2020/058439, mailed Apr. 6, 2021, 16 Pages.
International Search Report and Written Opinion for International Application No. PCT/US2020/059560, mailed Feb. 9, 2021, 9 Pages.
International Search Report and Written Opinion for International Application No. PCT/US2020/061218, mailed Feb. 16, 2021, 11 pages.
International Search Report and Written Opinion for International Application No. PCT/US2020/062991, mailed Feb. 24, 2021, 9 Pages.
International Search Report and Written Opinion for International Application No. PCT/US2020/066992, mailed May 17, 2021, 31 Pages.
International Search Report and Written Opinion for International Application No. PCT/US2021/014970, mailed Apr. 26, 2021, 8 Pages.
International Search Report and Written Opinion for International Application No. PCT/US2023/011630, mailed Apr. 6, 2023, 10 pages.
Khaled S.R., "A Review of Piezoelectric Polymers as Functional Materials for Electromechanical Transducers," Smart Materials and Structures, IOP Publishing LTD, Bristol, GB, Jan. 20, 2014 [retrieved on Jan. 20, 2014], vol. 23 (3), Article 33001, 29 pages, XP020258249, ISSN: 0964-1726, DOI: 10.1088/0964-1726/23/3/033001.
Levola T., "Diffractive Optics for Virtual Reality Displays," Journal of the Society for Information Display—SID, May 2006, vol. 14 (5), pp. 467-475, XP008093627.
Non-Final Office Action mailed Jul. 22, 2021 for U.S. Appl. No. 16/834,605, filed Mar. 30, 2020, 12 pages, [FACTP103US].
Non-Final Office Action mailed Jun. 30, 2023 for U.S. Appl. No. 17/556,436, filed Dec. 20, 2021, 25 pages.
Notice of Allowance mailed Jun. 7, 2023 for U.S. Appl. No. 16/716,050, filed Dec. 16, 2019, 18 pages.
Notice of Allowance mailed Sep. 12, 2023 for U.S. Appl. No. 17/324,803, filed May 19, 2021, 2 pages.
Notice of Allowance mailed May 15, 2023 for U.S. Appl. No. 16/421,441, filed May 23, 2019, 10 pages.
Notice of Allowance mailed Sep. 15, 2023 for U.S. Appl. No. 16/716,050, filed Dec. 16, 2019, 18 pages.
Notice of Allowance mailed Aug. 16, 2023 for U.S. Appl. No. 16/715,792, filed Dec. 16, 2019, 9 pages.

(56) References Cited

OTHER PUBLICATIONS

Notice of Allowance mailed Jul. 18, 2023 for U.S. Appl. No. 17/091,331, filed Nov. 6, 2020, 7 pages.
Notice of Allowance mailed Apr. 19, 2023 for U.S. Appl. No. 16/715,792, filed Dec. 16, 2019, 9 pages.
Notice of Allowance mailed Aug. 22, 2023 for U.S. Appl. No. 17/992,648, filed Nov. 22, 2022, 10 pages.
Notice of Allowance mailed Mar. 22, 2022 for U.S. Appl. No. 16/834,605, filed Mar. 30, 2020, 8 pages, [FACTP103US].
Notice of Allowance mailed May 22, 2023 for U.S. Appl. No. 17/324,803, filed May 19, 2021,5 pages.
Notice of Allowance mailed Mar. 27, 2023 for U.S. Appl. No. 17/127,670, filed Dec. 18, 2020,9 pages.
Notice of Allowance mailed Mar. 28, 2023 for U.S. Appl. No. 17/091,331, filed Nov. 6, 2020, 5 pages.
Notice of Allowance mailed Aug. 30, 2023 for U.S. Appl. No. 17/324,803, filed May 19, 2021, 5 pages.
Notice of Allowance mailed May 31, 2022 for U.S. Appl. No. 16/706,859, filed Dec. 9, 2019, 13 pages.
Office Action mailed Sep. 5, 2023 for Japanese Patent Application No. 2020-561752, filed on Nov. 2, 2020, 5 pages.
Office Action mailed Mar. 14, 2023 for Taiwan Application No. 108146257, filed Dec. 17, 2019, 25 pages.
Office Action mailed Sep. 20, 2023 for Taiwan Application No. 109139740, filed Nov. 13, 2020, 17 pages.
Office Action mailed Mar. 23, 2023 for Chinese Application No. 201980083991.5, filed Jun. 17, 2021,21 pages.
Notice of Allowance mailed Apr. 19, 2024 for U.S. Appl. No. 17/469,258, filed Sep. 8, 2021, 9 pages.
Office Action mailed Mar. 22, 2024 for European Patent Application No. 20757783.4, filed on Aug. 4, 2020, 6 pages.
Corrected Notice of Allowance mailed Oct. 13, 2023 for U.S. Appl. No. 17/324,803, filed May 19, 2021, 2 pages.
Non-Final Office Action mailed Dec. 8, 2023 for U.S. Appl. No. 17/645,904, filed Dec. 23, 2021, 19 pages.
Notice of Allowance mailed Nov. 1, 2023 for U.S. Appl. No. 17/091,331, filed Nov. 6, 2020, 7 pages.
Notice of Allowance mailed Mar. 6, 2024 for U.S. Appl. No. 17/127,670, filed Dec. 18, 2020, 9 pages.
Notice of Allowance mailed Dec. 12, 2023 for U.S. Appl. No. 17/992,648, filed Nov. 22, 2022, 10 pages.
Notice of Allowance mailed Oct. 13, 2023 for U.S. Appl. No. 16/421,441, filed May 23, 2019, 11 pages.
Notice of Allowance mailed Nov. 15, 2023 for U.S. Appl. No. 17/083,920, filed Oct. 29, 2020, 12 pages.
Notice of Allowance mailed Nov. 16, 2023 for U.S. Appl. No. 17/556,436, filed Dec. 20, 2021, 8 pages.
Notice of Allowance mailed Feb. 28, 2024 for U.S. Appl. No. 16/421,441, filed May 23, 2019, 18 pages.
Office Action mailed Dec. 7, 2023 for Chinese Application No. 201980092371.8, filed Dec. 17, 2019, 7 pages.
Office Action mailed Dec. 7, 2023 for Chinese Application No. 202080047086.7, filed Aug. 4, 2020, 7 pages.
Office Action mailed Dec. 12, 2023 for Japanese Patent Application No. 2021-526520, filed on Dec. 17, 2019, 5 pages.
Office Action mailed Jan. 25, 2024 for Chinese Application No. 202080073982.0, filed Oct. 30, 2020, 9 pages.
Office Action mailed Dec. 26, 2023 for Japanese Patent Application No. 2021-531109, filed on May 31, 2021, 2 pages.
Office Action mailed Jan. 29, 2024 for European Patent Application No. 19731047.7, filed on May 24, 2019, 5 pages.
Office Action mailed Jan. 31, 2024 for Korean Application No. 10-2020-7037369, filed May 24, 2019, 20 pages.

* cited by examiner

DYNAMICALLY PROGRAMMABLE IMAGE SENSOR

RELATED APPLICATION

This patent application claims priority to U.S. Provisional Patent Application Ser. No. 62/883,014, filed Aug. 5, 2019, entitled "ON-SENSOR PREDICTIVE SPARSE CAPTURE," which is assigned to the assignee hereof and is incorporated herein by reference in its entirety for all purposes.

BACKGROUND

The disclosure relates generally to image sensors, and more specifically to dynamically programmable image sensors.

A typical image sensor includes a pixel cell array. Each pixel cell may include a photodiode to sense light by converting photons into charge (e.g., electrons or holes). The charge converted at each pixel cell can be quantized to become a digital pixel value, and an image can be generated from an array of digital pixel values. The light sensing and image generation operations of an image sensor can be configured based on pre-determined programming signals.

SUMMARY

The present disclosure relates to image sensors. More specifically, and without limitation, this disclosure relates to an image sensor that is dynamically programmable by an integrated controller and by a host device based on image data captured by the image sensor.

In one example, an apparatus is provided. The apparatus comprises: a pixel cell array, each pixel cell in the pixel cell array including a photodiode and processing circuits, the photodiodes being formed in a first semiconductor substrate and the processing circuits formed in one or more second semiconductor substrates; and a controller formed in at least one of the one or more second semiconductor substrates, the first semiconductor substrate and the one or more second semiconductor substrates forming a stack and housed within a semiconductor package. The pixel cell array is configured to: generate, at a first time and based on first programming signals received from the controller, a first image frame; transmit the first image frame to a host processor; and transmit the first image frame or a second image frame to the controller, the second image frame being generated at the first time and having a different sparsity of pixels from the first image frame. The controller is configured to: receive the first image frame or a second image frame from the pixel cell array; receive second programming signals from a host processor, the second programming signals being determined by the host processor based on the first image frame; update the first programming signals based on the second programming signals; and control the pixel cell array to generate a subsequent image frame at a second time based on the updated first programming signals.

In some aspects, the apparatus further comprises the host processor. The controller is further configured to update the first programming signals at a frame rate at which the pixel cell array generates image frames. The host processor is configured to update the second programming signals at a rate lower than the frame rate.

In some aspects, the first programming signals comprise a first subset of the first programming signals identifying a first subset of pixel cells of the pixel cell array and a second subset of first programming signals identifying at a second subset of pixel cells of the pixel cell array. The controller is further configured to update the first subset of pixel cells identified by the first subset of the first programming signals, and update the second subset of pixel cells identified by the second subset of the first programming signals.

In some aspects, the first subset of the first programming signals control the first subset of pixel cells to output pixel data at a first resolution to the host processor. The second subset of the first programming signals control the second subset of pixel cells not to output pixel data, or to output pixel data at a second resolution lower than the first resolution, to the host processor.

In some aspects, the controller is further configured to: perform, based on the second programming signals, an image processing operation on the first image frame or the second image frame to generate a processing result; and update the first programming signals based on the processing result.

In some aspects, the image processing operation comprises: determining, for each pixel included in the first image frame or the second image frame, a pixel value difference with respect to a corresponding pixel in a third image frame generated by the pixel cell array prior to the first time; and identifying a subset of pixels in the first image frame or the second image frame for which the pixel value differences exceed a threshold. The controller is further configured to update the first programming signals based on identifying a subset of pixel cells of the pixel cell array, the subset of pixel cells being identified based on the subset of pixels. The second programming signals define the threshold.

In some aspects, the apparatus further comprises the host processor. The host processor is configured to set the threshold based on determining an ambient light intensity from the first image frame.

In some aspects, the image processing operation comprises identifying a subset of pixels in the first image frame or in the second image frame that include target features of an object of interest. The controller is further configured to update the first programming signals are updated based on identifying a subset of pixel cells of the pixel cell array, the subset of pixel cells being identified based on the subset of pixels. The second programming signals include information about the target features.

In some aspects, the second programming signals indicate an initial subset of pixels in the first image frame that include the target features. The image processing operation comprises identifying the subset of pixels based on determining whether the initial subset of pixels in the first image frame or in the second image frame include the target features of the object of interest.

In some aspects, the controller is further configured to: based on information about a movement of the object of interest and a time difference between the first time and the second time, determine the subset of pixels in the subsequent image frame that include the target features; and update the first programming signals based on determining a subset of pixel cells of the pixel cell array based on the subset of pixels in the subsequent image frame. The second programming signals include the information about the movement of the object of interest.

In some aspects, the second programming signals indicate that an initial subset of the pixels in the first image frame, defined based on the first programming signals, do not include all the target features. the image processing operation comprises, based on the second programming signals, identifying additional pixels that include the target features.

In some aspects, the controller includes a neural network model to perform the image processing operation. The second programming signals include at least one of: weights of the neural network model, backward propagation gradients to update the weights, a predicted accuracy of image processing operation, or intermediate outputs from the image processing operation.

In some aspects, each pixel cell of the pixel cell array or each block of pixel cells of the pixel cell array is individually addressable. The first programming signals comprise pixel-level signals individually targeted at each pixel cell or block-level signals targeted at each block of pixel cells.

In some aspects, the apparatus further comprises: pixel interconnects implemented by chip-to-chip copper bonding between the first semiconductor substrate and the one or more second semiconductor substrates to transmit signals generated by the photodiodes in the first semiconductor substrate to the processing circuits of pixel cell array in the one or more second semiconductor substrates; and through silicon vias (TSV) between the first semiconductor substrate and the one or more second semiconductor substrates to transmit the image frames from the pixel cell array to the controller, and to transmit the first programming signals from the controller to the pixel cell array.

In some aspects, the pixel cell array is coupled with the host processor via a point-to-point serial interface and is configured to transmit the image frames to the host processor via the point-to-point serial interface.

In some aspects, the controller is coupled with the host processor via a shared bus interface, the shared bus interface further coupled with other controllers. The controller is configured to receive the second programming signals from the host processor via the shared bus interface.

In some examples, a method is provided. The method comprises: controlling a pixel cell array to generate a first image frame at a first time based on first programming signals, and to transmit the first image frame to a host processor; receiving, from the pixel cell array, the first image frame or a second image frame from the pixel cell array, the second image frame being generated at the first time and having a different sparsity of pixels from the first image frame;

receiving second programming signals from the host processor, the second programming signals being determined by the host processor based on the first image frame; updating the first programming signals based on the second programming signals; and controlling the pixel cell array to generate a subsequent image frame at a second time based on the updated first programming signals.

In some aspects, the method further comprises: performing, based on the second programming signals, an image processing operation on the first image frame or the second image frame to generate a processing result; and updating the first programming signals based on the processing result.

In some aspects, the image processing operation comprises identifying a subset of pixels in the first image frame or in the second image frame that include target features of an object of interest. The first programming signals are updated based on identifying the subset of pixel cells. The second programming signals include information about the target features.

In some aspects, the pixel cell array transmits the first image frame to the host processor via a point-to-point serial interface. The second programming signals are received via a shared bus interface.

BRIEF DESCRIPTION OF THE DRAWINGS

Illustrative embodiments are described with reference to the following figures.

Figure 1A:
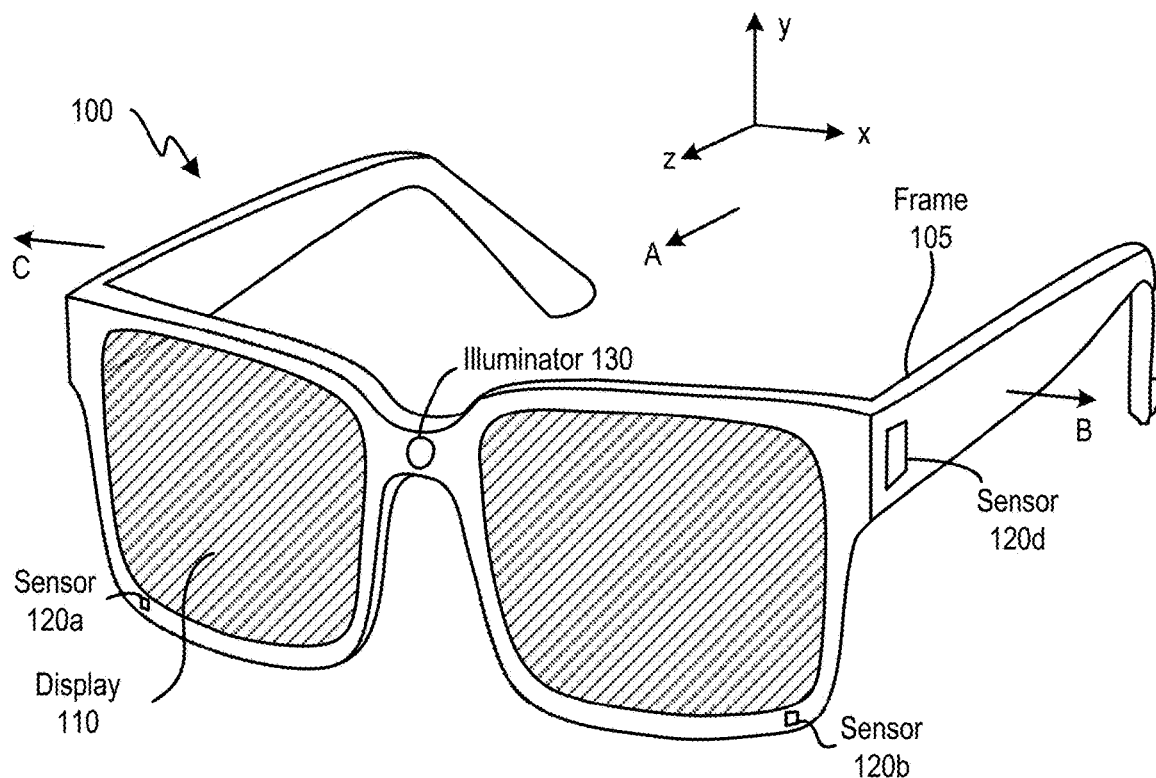
FIG. 1A and FIG. 1B are diagrams of an embodiment of a near-eye display.
Figure 1A:
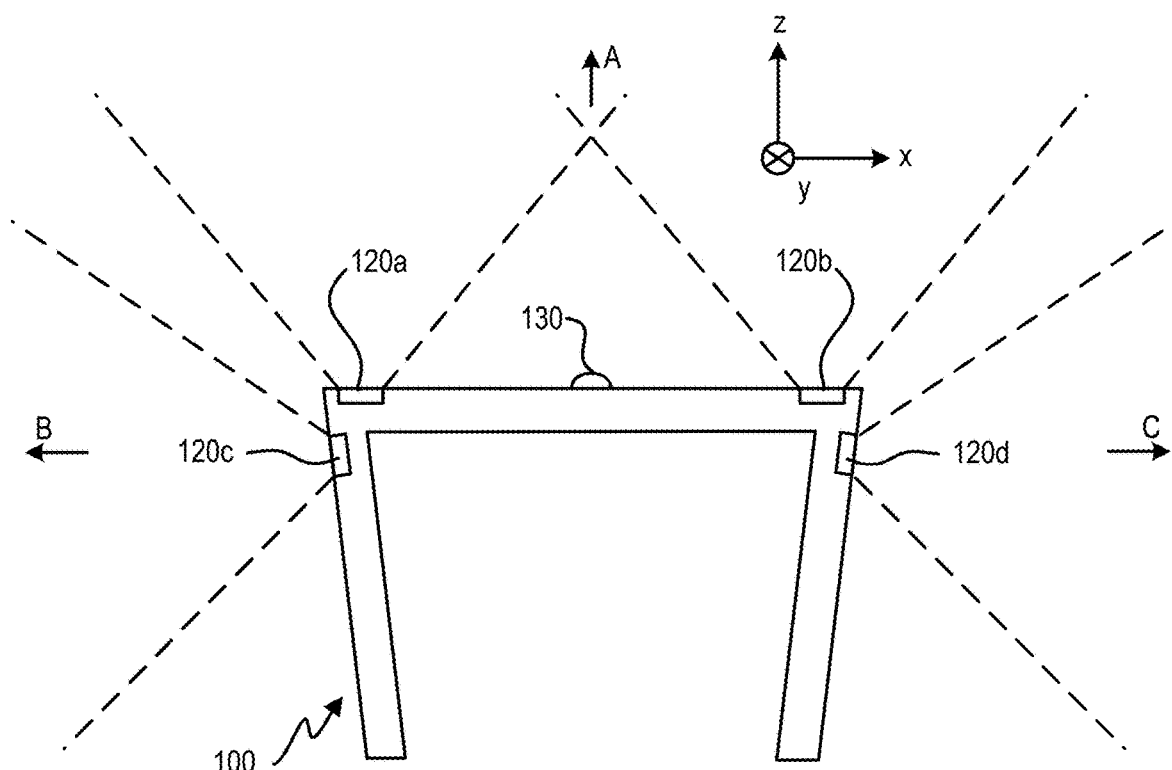

The figures depict embodiments of the present disclosure for purposes of illustration only. One skilled in the art will readily recognize from the following description that alternative embodiments of the structures and methods illustrated may be employed without departing from the principles of, or benefits touted in, this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

An image sensor includes a pixel cell array. Each pixel cell in the pixel cell array includes circuit components to perform a light sensing operation. For example, each pixel cell may include a photodiode to sense incident light by converting photons into charge (e.g., electrons or holes) and a charge sensing unit (e.g., a floating drain and a buffer) to convert the charge into a voltage. The image sensor may also include one or more analog-to-digital converters (ADCs) to quantize the voltage's output by the charge sensing units of the pixel cells into digital values. The ADC can quantize the charge by, for example, using a comparator to compare a voltage representing the charge with one or more quantization levels, and a digital value can be generated based on the comparison result. The digital values can then be stored in a memory to generate the image. An image sensor typically includes a controller to send out one or more chip-level programming signals to configure the operations of the pixel cells of the image sensor. For example, the controller can turn on or off all the pixel cells of the image sensor, set a global exposure time in which the pixel cells perform light sensing operations, etc.

The pixel data from an image sensor can support various applications, such as fusion of 2D and 3D sensing, recognition and tracking of objects of interest, location tracking, etc. These applications can extract features of one or more objects from the image, and perform computations based on the extracted features. For example, to perform 3D sensing, an application can identify pixels of reflected structured light (e.g., dots), compare a pattern extracted from the pixels with the transmitted structured light, and perform depth computation based on the comparison. The application can also identify 2D pixel data from the same pixel cells that provide the extracted pattern of structured light to perform fusion of 2D and 3D sensing. To perform object recognition and tracking, an application can also identify pixels of image features of the object, extract the image features from the pixels, and perform the recognition and tracking based on the extraction results. The object recognition and tracking results can support higher level applications, such as a simultaneous localization and mapping (SLAM) application, an eye tracking application, etc. These applications are typically executed on a host processor, which can be electrically connected with the image sensor and receive the pixel data via off-chip interconnects (e.g., Mobile Industry Processor Interface Camera Serial Interface (MIPI CSI) and I3C bus). The host processor, the image sensor, and the interconnects can be part of a system of a mobile device to support a particular application such as, for example, an object tracking application, a location tracking application (e.g., simultaneous localization and mapping (SLAM)), and/or a virtual/mixed/augmented reality application. In some examples, the host processor can also be in a cloud system, in which case the host processor can receive the image data from the image sensor via a wired communication network, a wireless communication network, etc.

While these host applications can benefit from the image data generated by the pixel cell array, the performance of the overall imaging system, such as power consumption, speed, accuracy, etc., can be limited by various factors. First, typically those applications have no control over the generation of the image data as well as the light sensing operations of these pixel cells. The lack of input from the host applications on the configuration of the pixel cells can impose limits on the achievable performance of the image sensor and these applications. For example, the host applications can benefit from high-resolution images and/or high frame rates. Higher-resolution images allow the application to extract more detailed features/patterns (e.g., more refined patterns of reflected structured light, more detailed image features), whereas providing images generated at a higher frame rate enables an application to track the location of an object, the location of the mobile device, etc., at a higher sampling rate, both processes of which can improve the performances of the applications. However, high-resolution images and high frame rates can lead to generation, transmission, and processing of a large volume of pixel data, which can present numerous challenges. For example, transmitting and processing a large volume of pixel data at a high data rate can lead to high power consumption at the image sensor, the interconnect, and the host processor. Moreover, the image sensor and the host processor may impose bandwidth limitations on and add latency to the generation and processing of large volumes of pixel data. The high power and high bandwidth requirement can be especially problematic for a mobile device which tends to operate with relatively low power and at a relatively low speed due to form factor and safety considerations.

In addition, typically the image sensor and the host processor are designed and optimized individually according to different specifications. Such arrangements can lead to inefficiency and waste of resources (e.g., power, bandwidth) at the image sensor and at the host processor when they are combined to form the imaging system, which in turn degrades the overall system performance. For example, the image sensor may be configured to generate pixel data from each pixel cell and transmit the pixel data to the host processor in every image frame, but the host processor may not need pixel data from each pixel cell in every image frame to track an object, especially in a case where the object of interest is only a small part of a scene captured in an image frame. On the other hand, the bandwidth of the interconnects, as well as the processing capabilities of the host processor, can impose a limit on the frame rate and the resolutions of the image frames. The limited frame rate can reduce the rate at which the host processor tracks the object, while the limited resolution can reduce the accuracy in distinguishing pixels of the object from the rest of the image frame. Both the limited frame rate and limited resolution can degrade the overall system performance in tracking the object.

This disclosure relates to an imaging system that can address at least some of the issues above. The imaging system includes an image sensor comprising an pixel cell array and a controller, and a host processor. The pixel cell array and the controller can be formed on the same semiconductor substrate, or formed on two semiconductor substrates forming a stack and housed within a semiconductor package. The pixel cell array and the controller can be communicatively coupled to each other using on-chip interconnects, such as through-silicon vias (TSV), in a case where the image sensor and the controller form a stack. The host processor can be an off-chip device communicatively coupled to the image sensor and the controller based on chip-to-chip interconnects such as MIPI CSI and I3C buses. In some examples, the host processor can be part of a cloud system and can be communicatively coupled with the image sensor and the controller via a wired communication network, a wireless communication network, etc.

Each pixel cell, or block of pixel cells, of the pixel cell array can be individually programmable to, for example, enable/disable outputting of a pixel value, set a resolution of the pixel value output by the pixel cell, etc. The pixel cell array can receive a first programming signal, which can be in the form of a programming map, from the controller, and generate a first image frame, at a first time, based on sensing light from a scene and based on the first programming signal. Specifically, the pixel cell array can be controlled by the first programming signals to operate in multiple sparsity modes, such as in a full-frame mode in which the first image frame includes a full image frame of pixels, and/or in a sparse mode in which the first image frame only includes a subset of the pixels specified by the programming map. The pixel cell array can output the first image frame to both the host processor and to the controller. In some examples, the pixel cell array can also generate a second image frame at the same first time as the first image frame, and transmit the first image frame to the host processor and the second image frame to the controller. The first image frame can have sparse pixels, whereas the second image frame can have a full frame of pixels.

The controller and the host processor, together with the image sensor, can form a two-tier feedback system based on the first image frame to control the image sensor to generate a subsequent image frame. In a two-tier feedback operation, the controller can perform an image processing operation on the first image frame or the second image frame to obtain a processing result, and then adjust the first programming signals based on the processing result. The image processing operation at the controller can be guided/configured based on a second programming signals received from the host processor, which can generate the second programming signals based on the first image frame. The pixel cell array then generates a subsequent image frame, at a second time, based on the updated first programming signal.

In some examples, the image processing operation can include extracting/detecting pixels having certain target spatial and/or temporal features. As an example, the objective of the image processing operation may include identifying pixels that include spatial features, keypoints, etc., of a pre-determined object (e.g., a human face, a body part, or certain physical objects in a scene). As another example, the objective of the image processing operation may include identifying pixels that experience a pre-determined degree of changes in the pixel values between frames (e.g., having a pre-determined temporal contrast), to enable detection/measurement of a motion of an object. The programming map can be generated based on determining which of the pixels in the first frame contain the target feature, to control the image sensors such that only pixel cells corresponding to those pixels will output the pixel data to the host processor and/or to the controller. Meanwhile, the host processor can define, as part of the second programming signal, the target image feature to be detected, an approximate location of the target image feature in the first image frame, etc. The controller can either perform the image feature extraction operation directly based on the second programming signal, or further refine the second programming signals (e.g., to estimate a more precise location of the target image feature) and perform the image feature extraction operation based on the refined second programming signal.

The controller can employ various techniques to extract/detect target features from an image. For example, the controller may implement a neural network, such as convolution neural network (CNN), to perform arithmetic operations on the pixel data with weights to perform the extraction. The controller may include memory devices (e.g., spin tunneling random access memory (STRAM), non-volatile random access memory (NVRAM)) to store the weights.

In the aforementioned two-tier feedback system, the host processor can execute an application to perform an analysis of the first image frame to generate the second programming signal. In some examples, the second programming signals can be in the form of a teaching/guidance signal, the result of a neural network training operation (e.g., backward propagation results), a predicted accuracy of image processing operation, or intermediate outputs from the image processing operation, etc., to influence the image processing operation and/or programming map generation at the controller. For example, the host processor and the controller can take part in a training operation, with the host processor performing the training on the lower-level layers based on more generic images, whereas the controller continues the training on the higher-level layers based on images captured by the pixel cell array. As another example, the host processor can provide a predicted accuracy of the image processing operation performed by the neural network as feedback, which allows the neural network to update the weights to improve the predicted accuracy of the image processing operation.

The host processor can perform the analysis based on not just the first image frame but also other sensor data (e.g., other image frames captured by other image sensors, audio information, motion sensor outputs, inputs from the user) to determine a context of the light sensing operation, and then determine the teaching/guidance signal. The context may include, for example, an environmental condition the image sensor operates in, a location of the image sensor, or any other requirements of the application that consumes the pixel data from the image sensor. The teaching/guidance signals can be updated at a relatively low rate (e.g., lower than the frame rate) based on the context, given that the context typically changes at a much lower rate than the frame rate, while the image processing operation and the updating of the programming map can occur at a relatively high rate (e.g., at the frame rate) to adapt to the images captured by the pixel cell array.

With the disclosed techniques, a closed loop feedback system can be implemented to dynamically configure the operations at the image sensor, which can further improve the overall performance of the system. Specifically, the controller can program the pixel cell array to perform a sparse capture operation, in which only output a subset of pixels based on performing an image feature operation on the first image frame, which allows the image sensor to output only the pixel data of interest to the host processor. The pixel data of interest include pixel data needed to support an application at the host processor. For example, in a case where the host processor tracks an object, the pixel data of interest include the pixel data of the object being tracked, while pixel data not part of the object are not transmitted to the host processor. Due to the sparsity of the pixel data of interest, such pixel data can be transmitted at a higher speed or generated at a higher precision compared with a case where full frames of pixels are transmitted to the host processor. By providing only pixel data of interest to the host processor at a higher speed and/or at a higher accuracy, the performance and efficiency of the system can be improved. Moreover, as the pixel cell array and the controller are tightly integrated within a single semiconductor package, the feedback system can be operated at a high speed. For example, the controller can update the programming map at the same frame rate as the generation of the image frames by the pixel cell array. As a result, the updating of the first programming signals can be more responsive to the image data captured by the pixel cell array and the change in the operation condition of the image sensor, which can further improve the performance of the system.

In addition, by having the host processor to send the second programming signals to configure the image processing operations at the controller, an additional closed loop feedback system can be provided to further improve the image processing operations at the controller (and the generation of the first programming signals) based on better knowledge of the operation condition of the image sensor. Specifically, the host processor may execute an application that uses the image data from the image sensor to perform various operations, such as an object tracking operation, a location determination operation, a virtual/mixed/augmented reality operation, etc. The host processor can combine data from different sensors, or otherwise track a context/environment of the image sensor, to determine the most up-to-date context/environment.

The host processor can then generate, as part of the second programming signal, guidance information based on the most up-to-date context/environment, and provide the guidance information to the controller to influence its image feature extraction operation. For example, the host processor can determine the target object to be tracked, an initial/approximate location of the target object, the target feature (spatial feature, temporal feature, etc.) to be tracked, etc., and provide those information to adapt the image processing operation at the controller to the changes in the context. Such arrangements can improve the likelihood of the controller extracting/detecting the target features from the image data. For example, due to a change in the scene and/or the location of the image sensor, the host processor may request the controller to track a different object, to set a different temporal contrast threshold for selecting pixels that change between frames, etc. This allows the image processing operation to be adaptive to the change in the operation condition of the image sensor, which in turn can improve the likelihood that the controller can identify pixels having the target feature for a given application.

There are also various advantages of having the host processor to provide guidance information to the controller. Specifically, having the host processor to provide the guidance information can alleviate the controller from the burden of tracking the context of the image sensing operation, as the controller may not have the computation resource to execute the aforementioned applications to track/determine the context, while the controller can receive the context information from the host processor. Moreover, given that the change in the context typically occurs at a much slower pace than the generation of images, the host processor can generate and transmit the guidance information at a lower rate and using a low-bandwidth chip-to-chip interconnect, such as I3C, to further reduce power consumption of the system. All these can further improve the efficiency and overall performance of the system, especially in capturing images of fast-changing scenes to support object tracking applications, SLAM applications, etc.

The disclosed techniques may include or be implemented in conjunction with an artificial reality system. Artificial reality is a form of reality that has been adjusted in some manner before presentation to a user, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an embodiment of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 comprises a waveguide display assembly for directing light from one or more images to an eye of the user.

Near-eye display 100 further includes image sensors 120a, 120b, 120c, and 120d. Each of image sensors 120a, 120b, 120c, and 120d may include a pixel array configured to generate image data representing different fields of views along different directions. For example, sensors 120a and 120b may be configured to provide image data representing two fields of view towards a direction A along the Z axis, whereas sensor 120c may be configured to provide image data representing a field of view towards a direction B along the X axis, and sensor 120d may be configured to provide image data representing a field of view towards a direction C along the X axis.

In some embodiments, sensors 120a-120d can be configured as input devices to control or influence the display content of the near-eye display 100 to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120a-120d can provide the location tracking system a more holistic view of the physical environment, which can lead to more objects to be included in the construction and updating of the map. With such an arrangement, the accuracy and robustness of tracking a location of the user within the physical environment can be improved.

In some embodiments, near-eye display 100 may further include one or more active illuminators 130 to project light into the physical environment. The light projected can be associated with different frequency spectrums (e.g., visible light, infra-red light, ultra-violet light), and can serve various purposes. For example, illuminator 130 may project light in a dark environment (or in an environment with low intensity of infra-red light, ultra-violet light, etc.) to assist sensors 120a-120d in capturing images of different objects within the dark environment to, for example, enable location tracking of the user. Illuminator 130 may project certain markers onto the objects within the environment, to assist the location tracking system in identifying the objects for map construction/updating.

In some embodiments, illuminator 130 may also enable stereoscopic imaging. For example, one or more of sensors 120a or 120b can include both a first pixel array for visible light sensing and a second pixel array for infra-red (IR) light sensing. The first pixel array can be overlaid with a color filter (e.g., a Bayer filter), with each pixel of the first pixel array being configured to measure intensity of light associated with a particular color (e.g., one of red, green or blue colors). The second pixel array (for IR light sensing) can also be overlaid with a filter that allows only IR light through, with each pixel of the second pixel array being configured to measure intensity of IR lights. The pixel arrays can generate an RGB image and an IR image of an object, with each pixel of the IR image being mapped to each pixel of the RGB image. Illuminator 130 may project a set of IR markers on the object, the images of which can be captured by the IR pixel array. Based on a distribution of the IR markers of the object as shown in the image, the system can estimate a distance of different parts of the object from the IR pixel array, and generate a stereoscopic image of the object based on the distances. Based on the stereoscopic image of the object, the system can determine, for example, a relative position of the object with respect to the user, and can update the image data provided to display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without active illuminator 130 being turned on. As a result, image sensors 120a-120d may need to have a wide dynamic range to be able to operate properly (e.g., to generate an output that correlates with the intensity of incident light) across a very wide range of light intensities associated with different operating environments for near-eye display 100.

Figure 1B:
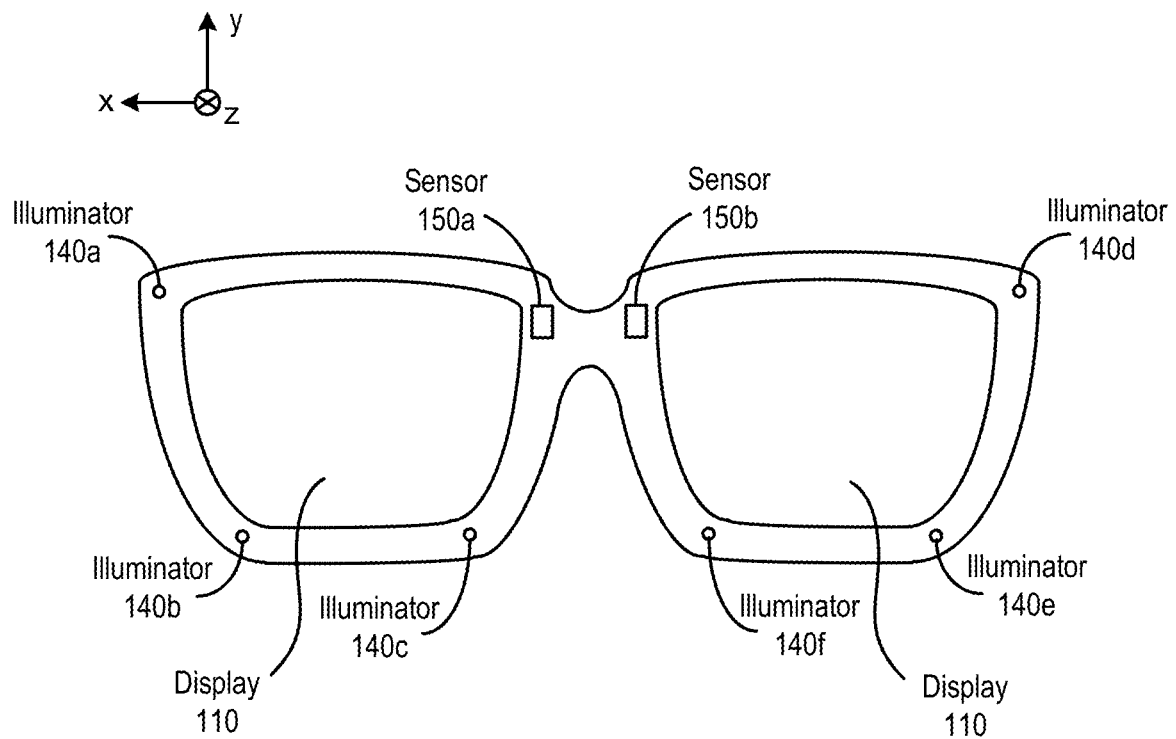
Figure 1B:
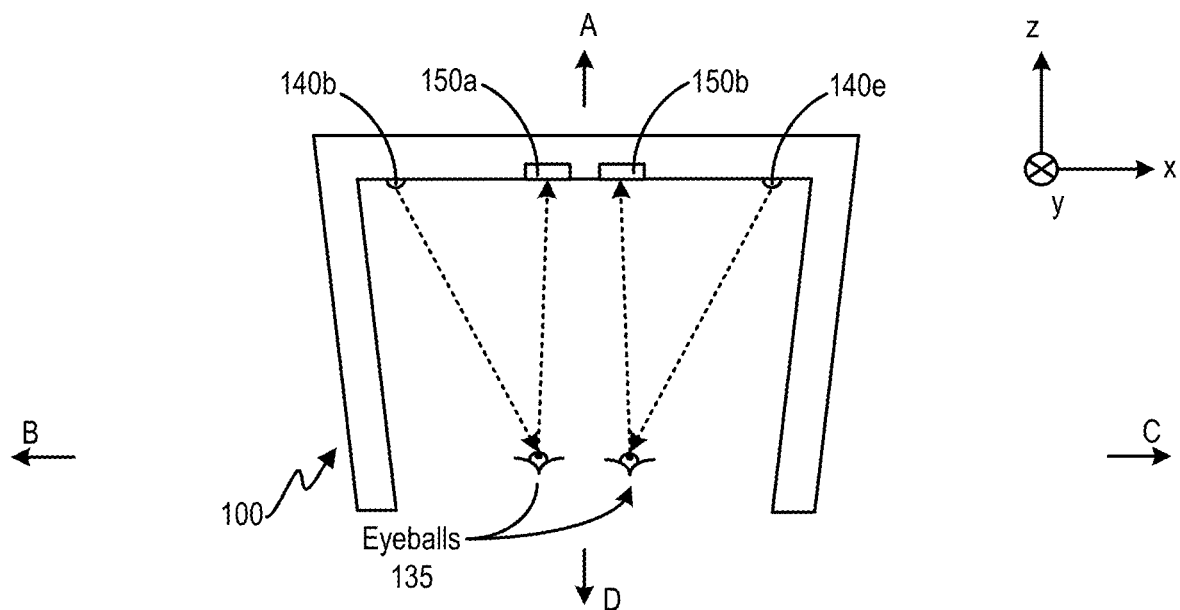

FIG. 1B is a diagram of another embodiment of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain frequency range (e.g., NIR) towards direction D (which is opposite to direction A of FIG. 1A). The emitted light may be associated with a certain pattern, and can be reflected by the left eyeball of the user. Sensor 150a may include a pixel array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor 150b. Sensor 150b may also include a pixel array to generate an image of the reflected pattern. Based on the images of the reflected pattern from sensors 150a and 150b, the system can determine a gaze point of the user, and update the image data provided to display 100 based on the determined gaze point to provide an interactive experience to the user.

As discussed above, to avoid damaging the eyeballs of the user, illuminators 140a, 140b, 140c, 140d, 140e, and 140f are typically configured to output lights of very low intensities. In a case where image sensors 150a and 150b comprise the same sensor devices as image sensors 120a-120d of FIG. 1A, the image sensors 120a-120d may need to be able to generate an output that correlates with the intensity of incident light when the intensity of the incident light is very low, which may further increase the dynamic range requirement of the image sensors.

Moreover, the image sensors 120a-120d may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120a-120d need to generate images of the eyeball at high speed. For example, the rate at which the image sensors generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensors also need to be able to operate at an environment with low light intensity.

Figure 2:
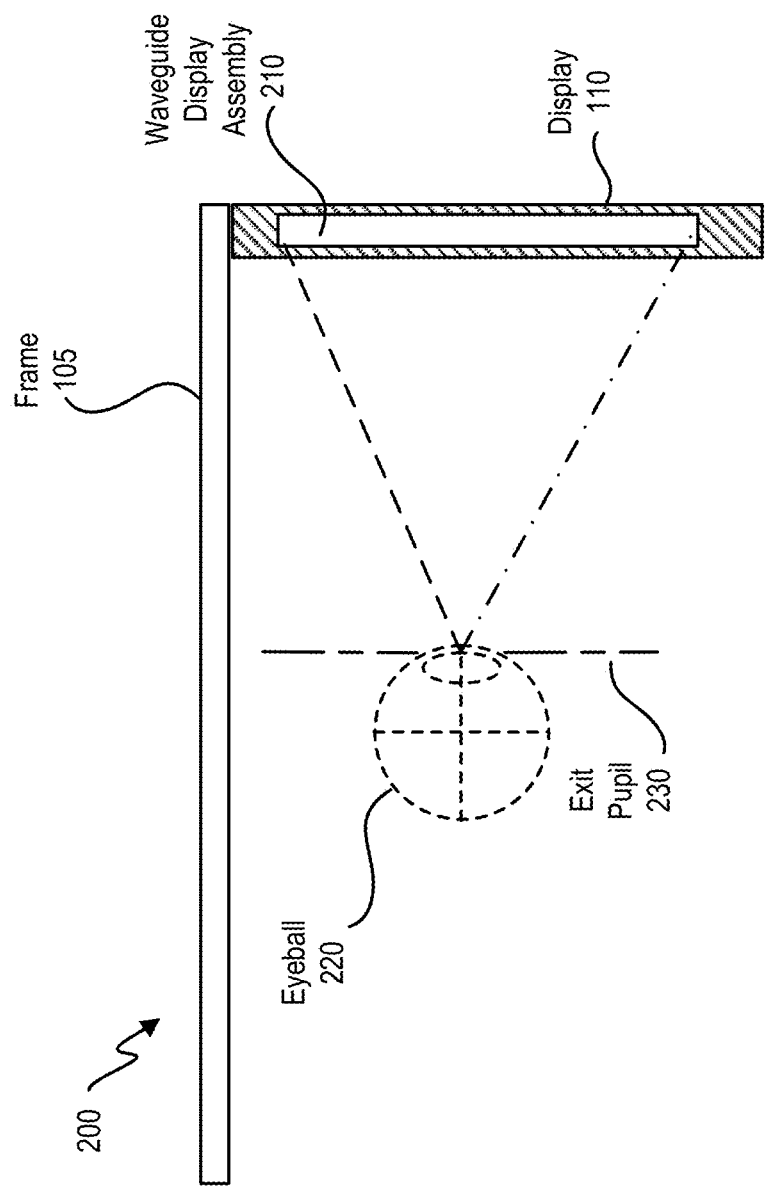
FIG. 2 is an embodiment of a cross section of the near-eye display.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
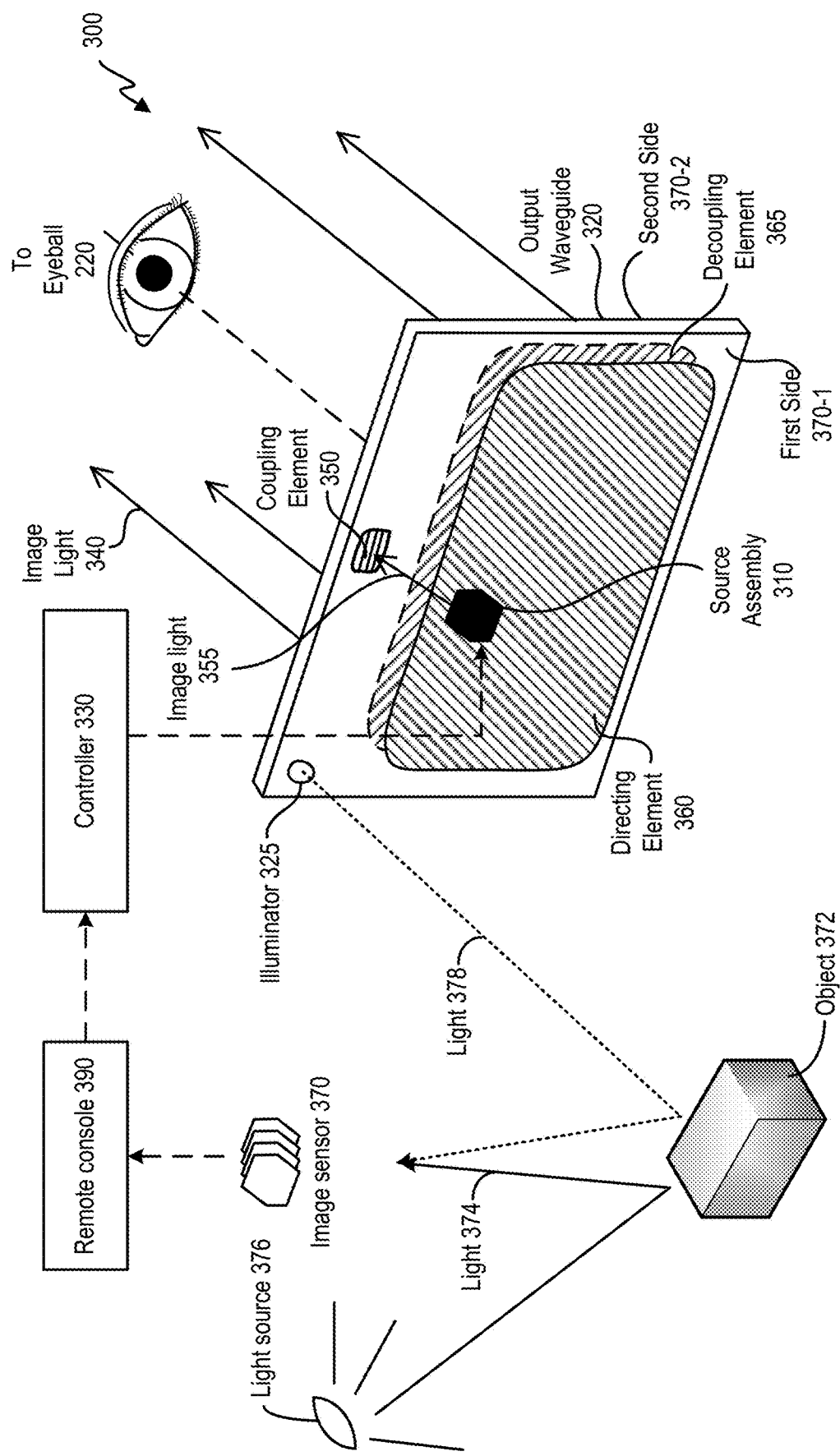
FIG. 3 illustrates an isometric view of an embodiment of a waveguide display with a single source assembly.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, and a controller 330. For purposes of illustration, FIG. 3 shows the waveguide display 300 associated with a single eyeball 220, but in some embodiments, another waveguide display separate, or partially separate, from the waveguide display 300 provides image light to another eye of the user.

Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some embodiments, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A. Image sensors 120a-120d can be operated to perform 2D sensing and 3D sensing of, for example, an object 372 in front of the user (e.g., facing first side 370-1). For 2D sensing, each pixel cell of image sensors 120a-120d can be operated to generate pixel data representing an intensity of light 374 generated by a light source 376 and reflected off object 372. For 3D sensing, each pixel cell of image sensors 120a-120d can be operated to generate pixel data representing a time-of-flight measurement for light 378 generated by illuminator 325. For example, each pixel cell of image sensors 120a-120d can determine a first time when illuminator 325 is enabled to project light 378 and a second time when the pixel cell detects light 378 reflected off object 372. The difference between the first time and the second time can indicate the time-of-flight of light 378 between image sensors 120a-120d and object 372, and the time-of-flight information can be used to determine a distance between image sensors 120a-120d and object 372. Image sensors 120a-120d can be operated to perform 2D and 3D sensing at different times, and provide the 2D and 3D image data to a remote console 390 that may be (or may not be) located within waveguide display 300. The remote console may combine the 2D and 3D images to, for example, generate a 3D model of the environment in which the user is located, to track a location and/or orientation of the user, etc. The remote console may determine the content of the images to be displayed to the user based on the information derived from the 2D and 3D images. The remote console can transmit instructions to controller 330 related to the determined content. Based on the instructions, controller 330 can control the generation and outputting of image light 355 by source assembly 310, to provide an interactive experience to the user.

Figure 4:
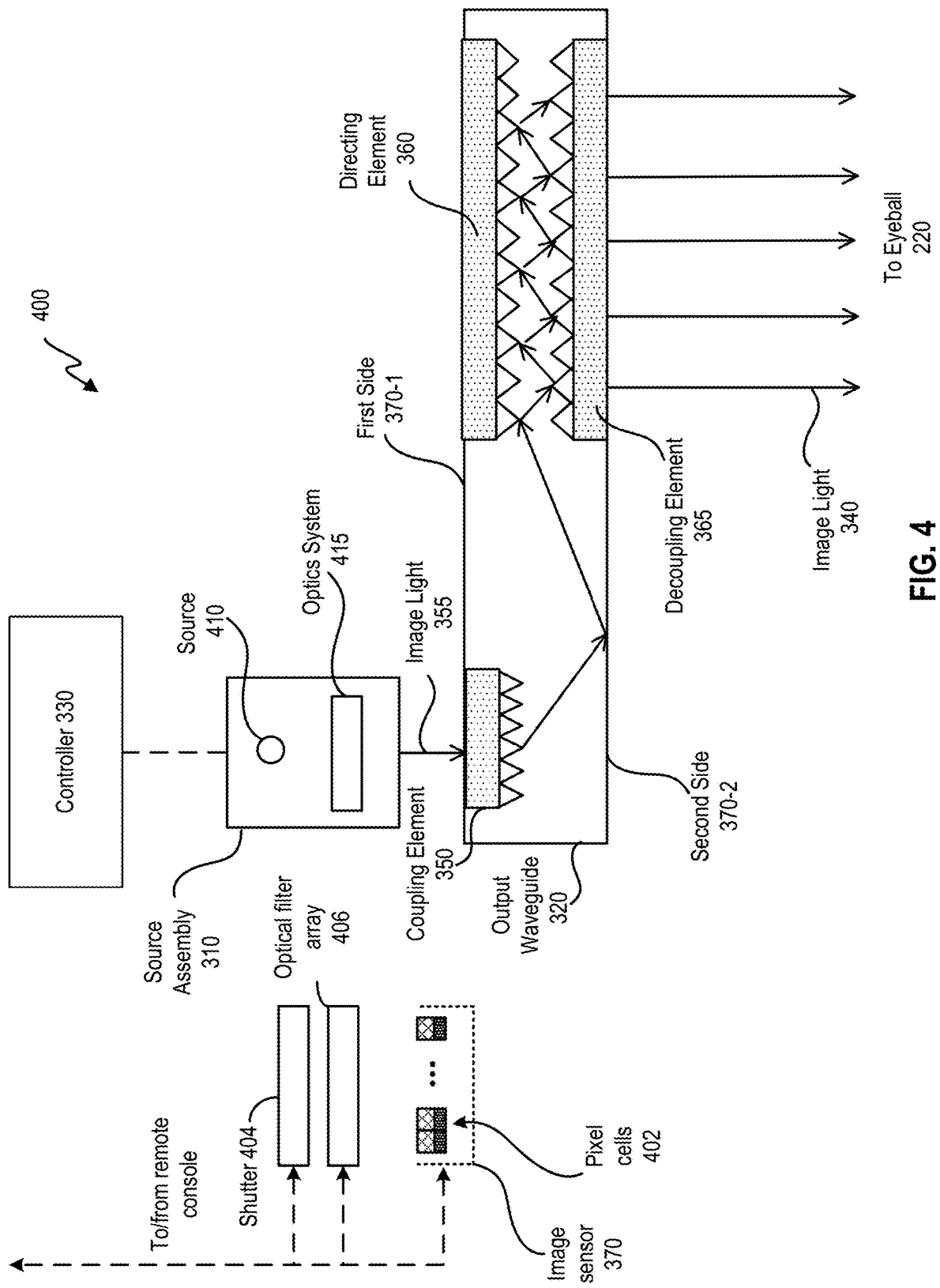
FIG. 4 illustrates a cross section of an embodiment of the waveguide display.

FIG. 4 illustrates an embodiment of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some embodiments, there can be a mechanical shutter 404 and an optical filter array 406 interposed between the set of pixel cells 402 and the physical environment. Mechanical shutter 404 can control the exposure of the set of pixel cells 402. In some embodiments, the mechanical shutter 404 can be replaced by an electronic shutter gate, as to be discussed below. Optical filter array 406 can control an optical wavelength range of light the set of pixel cells 402 is exposed to, as to be discussed below. Each of pixel cells 402 may correspond to one pixel of the image. Although not shown in FIG. 4, it is understood that each of pixel cells 402 may also be overlaid with a filter to control the optical wavelength range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is a diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
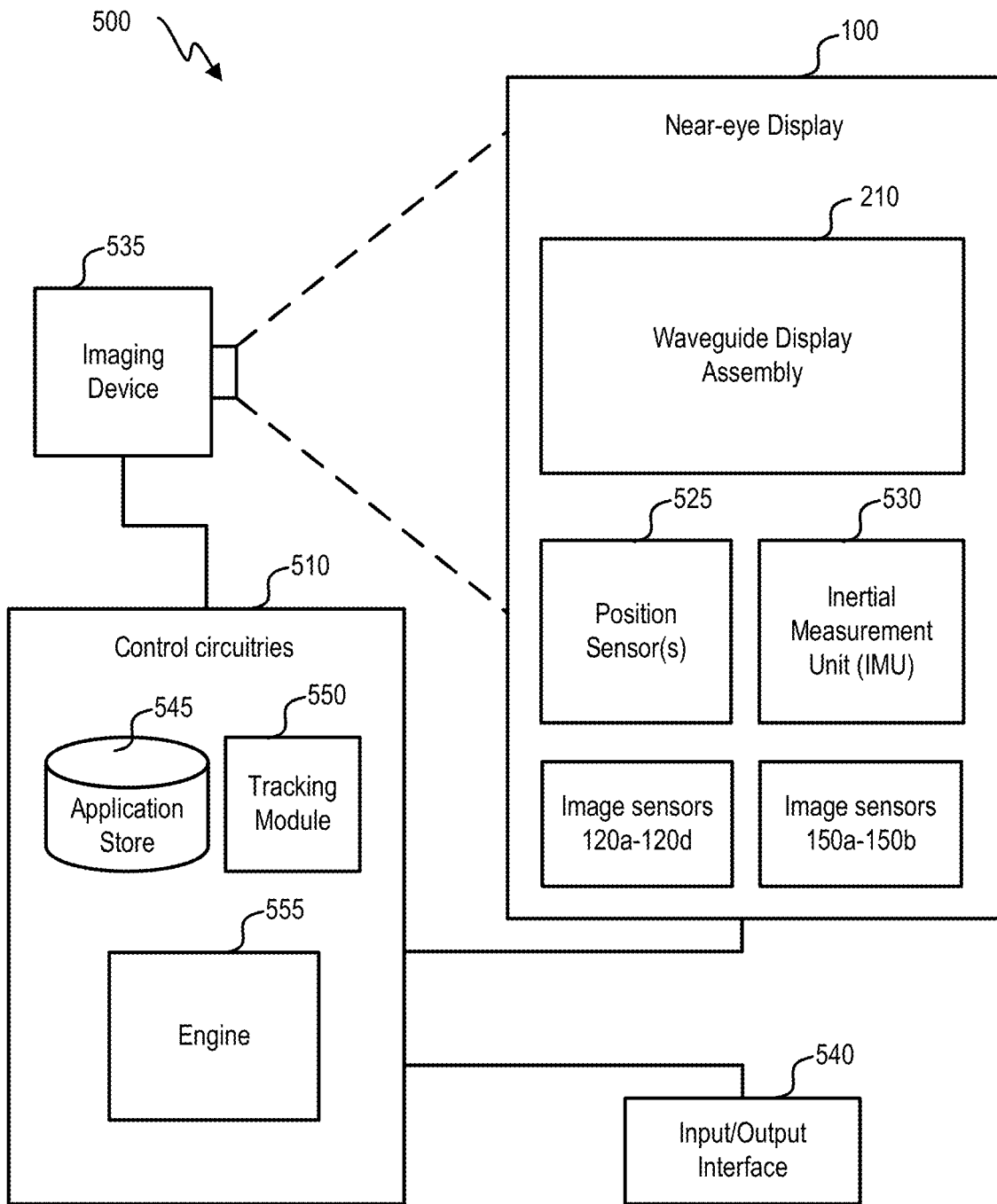
FIG. 5 is a block diagram of an embodiment of a system including the near-eye display.

FIG. 5 is a block diagram of an embodiment of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a mobile device, a wearable device, etc.

Near-eye display 100 is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 510 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating image data of a physical environment in which the user is located for performing location tracking of the user. Imaging device 535 may further include, for example, image sensors 150a-150b of FIG. 1B for generating image data for determining a gaze point of the user to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provide media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions that, when executed by a processor, generates content for presentation to the user. Examples of applications include: gaming applications, conferencing applications, video playback applications, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), or a gaze point of the user (e.g., based on image data provided by imaging device 535), a distance between an object and user (e.g., based on image data provided by imaging device 535).

Figure 6A:
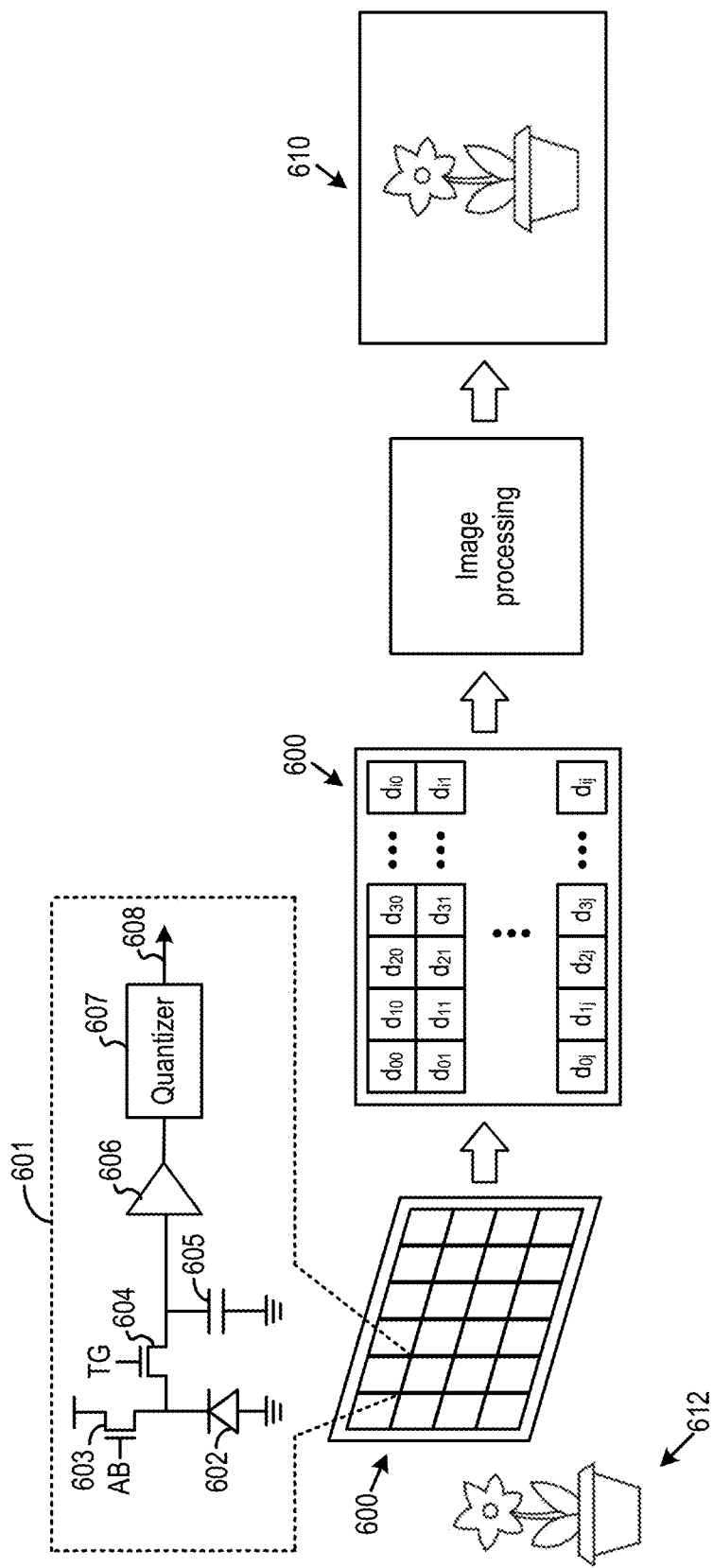
FIG. 6A and FIG. 6B illustrate examples of an image sensor and its operations.
Figure 6B:
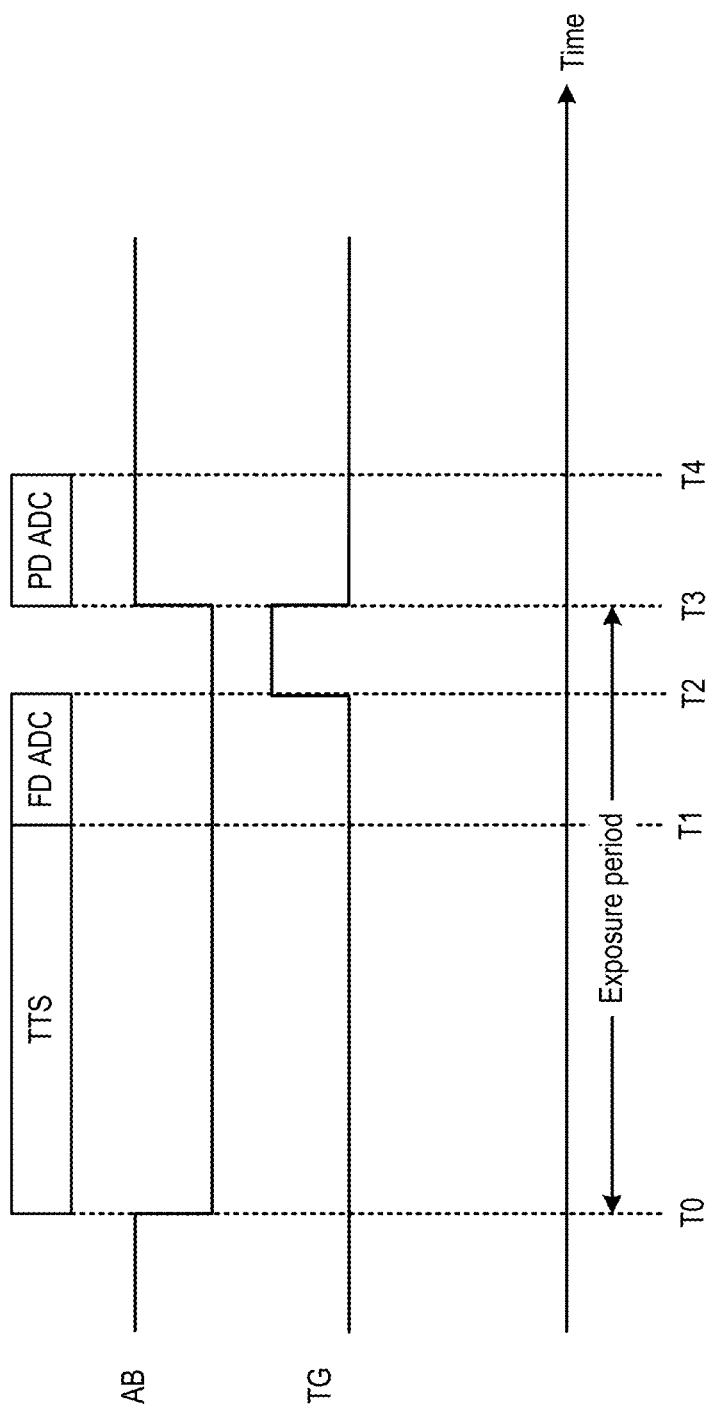

FIG. 6A and FIG. 6B illustrate examples of an image sensor 600 and its operations. As shown in FIG. 6A, image sensor 600 can include a pixel cell array, including pixel cell 601, and can generate digital intensity data corresponding to pixels of an image. Pixel cell 601 may be part of pixel cells 402 of FIG. 4. As shown in FIG. 6A, pixel cell 601 may include a photodiode 602, an electronic shutter switch 603, a transfer switch 604, a charge storage device 605, a buffer 606, and a quantizer 607. Photodiode 602 may include, for example, a P-N diode, a P-I-N diode, a pinned diode, etc., whereas charge storage device 605 can be a floating drain node of transfer switch 604. Photodiode 602 can generate and accumulate residual charge upon receiving light within an exposure period. Upon saturation by the residual charge within the exposure period, photodiode 602 can output overflow charge to charge storage device 605 via transfer switch 604. Charge storage device 605 can convert the overflow charge to a voltage, which can be buffered by buffer 606. The buffered voltage can be quantized by quantizer 607 to generate measurement data 608 to represent, for example, the intensity of light received by photodiode 602 within the exposure period.

Quantizer 607 may include a comparator to compare the buffered voltage with different thresholds for different quantization operations associated with different intensity ranges. For example, for a high intensity range where the quantity of overflow charge generated by photodiode 602 exceeds a saturation limit of charge storage device 605, quantizer 607 can perform a time-to-saturation (TTS) measurement operation by detecting whether the buffered voltage exceeds a static threshold representing the saturation limit, and if it does, measuring the time it takes for the buffered voltage to exceed the static threshold. The measured time can be inversely proportional to the light intensity. Also, for a medium intensity range in which the photodiode is saturated by the residual charge but the overflow charge remains below the saturation limit of charge storage device 605, quantizer 607 can perform an FD ADC operation to measure a quantity of the overflow charge stored in charge storage device 605. Further, for a low intensity range in which the photodiode is not saturated by the residual charge and no overflow charge is accumulated in charge storage device 605, quantizer 607 can perform a PD ADC operation to measure a quantity of the residual charge accumulated in photodiode 602. The output of one of TTS, FD ADC, or PD ADC operation can be output as measurement data 608 to represent the intensity of light.

FIG. 6B illustrates an example sequence of operations of pixel cell 601. As shown in FIG. 6B, the exposure period can be defined based on the timing of AB signal controlling electronic shutter switch 603, which can steer the charge generated by photodiode 602 away when enabled, and based on the timing of the TG signal controlling transfer switch 604, which be controlled to transfer the overflow charge and then the residual charge to charge storage device 605 for read out. For example, referring to FIG. 6B, the AB signal can be de-asserted at time T0 to allow photodiode 602 to generate a charge. T0 can mark the start of the exposure period. Within the exposure period, the TG signal can set transfer switch 604 at a partially-on state to allow photodiode 602 to accumulate at least some of the charge as residual charge until photodiode 602 saturates, after which overflow charge can be transferred to charge storage device 605. Between times T0 and T1, quantizer 607 can perform a TTS operation to determine whether the overflow charge at charge storage device 605 exceeds the saturation limit, and then between times T1 and T2, quantizer 607 can perform a FD ADC operation to measure a quantity of the overflow charge at charge storage device 605. Between times T2 and T3, the TG signal can be asserted to bias transfer switch 604 in a fully-on state to transfer the residual charge to charge storage device 605. At time T3, the TG signal can be de-asserted to isolate charge storage device 605 from photodiode 602, whereas the AB signal can be asserted to steer the charge generated by photodiode 602 away. The time T3 can mark the end of the exposure period.

Between times T3 and T4, quantizer 607 can perform a PD operation to measure a quantity of the residual charge.

The AB and TG signals can be generated by a controller (not shown in FIG. 6A) which can be part of pixel cell 601 to control the duration of the exposure period and the sequence of quantization operations. The controller can also detect whether charge storage device 605 is saturated and whether photodiode 602 is saturated to select the outputs from one of the TTS, FD ADC, or PD ADC operations as measurement data 608. For example, if charge storage device 605 is saturated, the controller can provide the TTS output as measurement data 608. If charge storage device 605 is not saturated but photodiode 602 is saturated, the controller can provide the FD ADC output as measurement data 608. If photodiode 602 is not saturated, the controller can provide the PD ADC output as measurement data 608. The measurement data 608 from each pixel cells of image sensor 600 generated within the exposure period can form an image frame. The controller can repeat the sequence of operations in FIG. 6B in subsequent exposure periods to generate subsequent image frames.

Figure 7A:
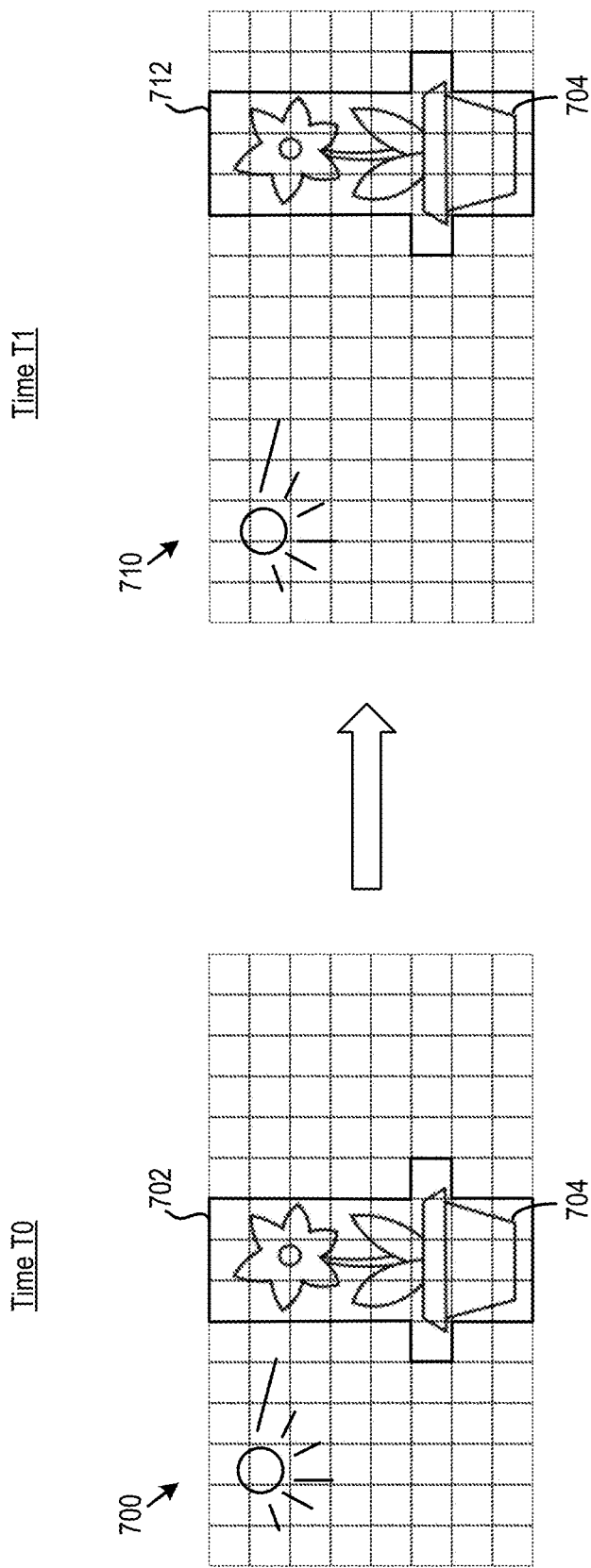
FIG. 7A, FIG. 7B, FIG. 7C, and FIG. 7D illustrate examples of applications to be supported by imaging systems according to examples of the present disclosure.

The image frame data from image sensor 600 can be transmitted to a host processor (not shown in FIG. 6A and FIG. 6B) to support different applications, such as tracking one or more objects, detecting a motion (e.g., as part of a dynamic vision sensing (DVS) operation), etc. FIG. 7A-FIG. 7D illustrate examples of applications that can be supported by the image frame data from image sensor 600. FIG. 7A illustrates an example of an object-tracking operation based on image frames from image sensor 600. As shown in FIG. 7A, an application operating at the host processor can identify group of pixels in a region of interest (ROI) 702 corresponding to object 704 from an image frame 700 captured at time T0. The application can continue to track the location of object 704 in subsequent image frames, including image frame 710 captured at time T1, and identify group of pixels in ROI 712 corresponding to object 704. The tracking of the image location of object 704 within an image frame can be performed to support a SLAM algorithm, which can construct/update a map of an environment in which image sensor 600 (and a mobile device that includes image sensor 600, such as near-eye display 100) is situated, based on tracking the image location of object 704 in a scene captured by image sensor 600.

Figure 7B:
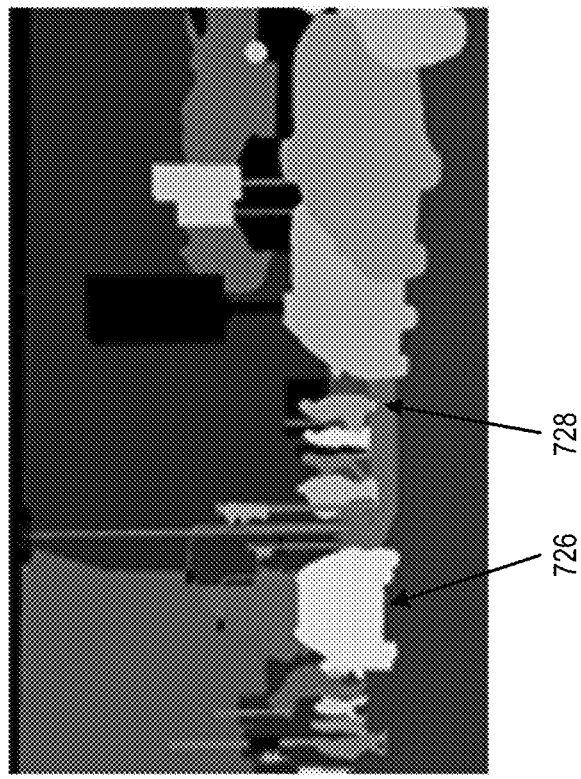
Figure 7B:
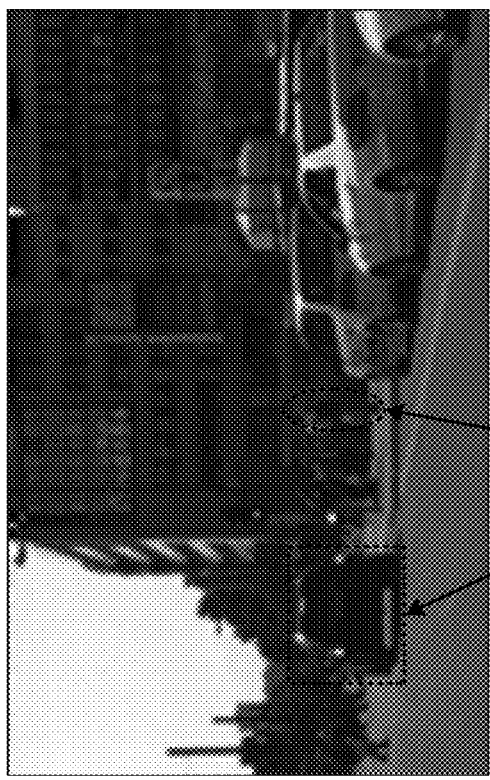

FIG. 7B illustrates an example of an object detection operation on image frames from image sensor 600. As shown on the left of FIG. 7B, the host processor may identify one or more objects in a scene captured in an image frame 720, such as a vehicle 722 and a person 724. As shown on the right of FIG. 7B, based on the identification, the host processor may determine that group of pixels 726 corresponds to vehicle 722, whereas group of pixels 728 corresponds to person 724. The identification of vehicle 722 and person 724 can be performed to support various applications, such as a surveillance application in which vehicle 722 and person 724 are surveillance targets, a mixed reality (MR) application in which vehicle 722 and person 724 are replaced with virtual objects, a foveated imaging operation to reduce the resolution of certain images (e.g., license plates of vehicle 722, the face of person 724) for privacy, etc.

Figure 7C:
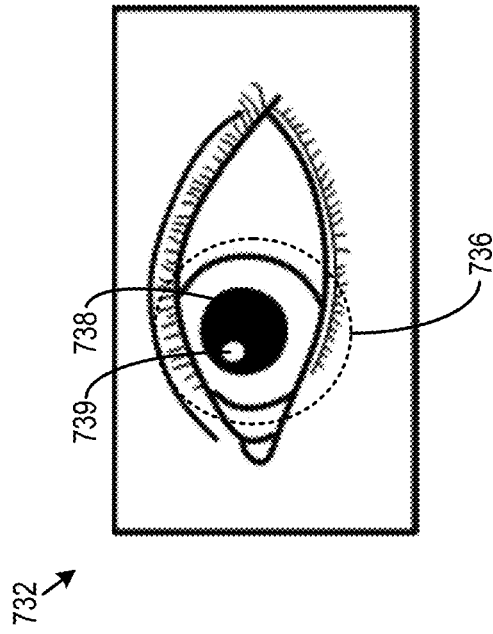
Figure 7C:
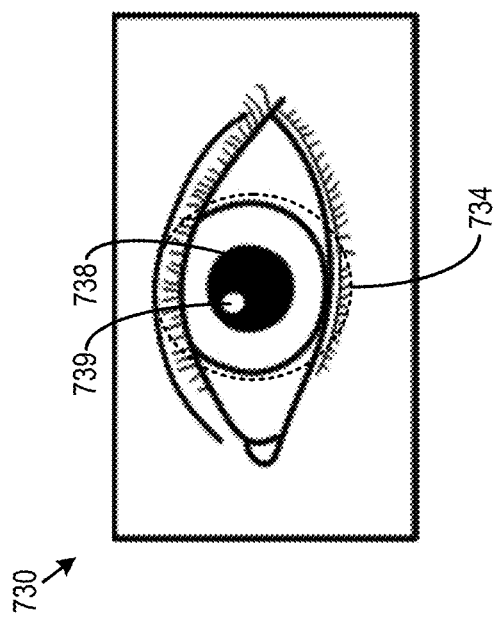

FIG. 7C illustrates an example of an eye-tracking operation on image frames from image sensor 600. As shown in FIG. 7C, the host processor may identify, from image 730 and 732 of an eyeball, a group of pixels 734 and 736 corresponding to a pupil 738 and a glint 739. The identification of pupil 738 and glint 739 can be performed to support the eye-tracking operation. For example, based on the image locations of pupil 738 and glint 739, the application can determine the gaze directions of the user at different times, which can be provided as inputs to the system to determine, for example, the content to be displayed to the user.

Figure 7D:
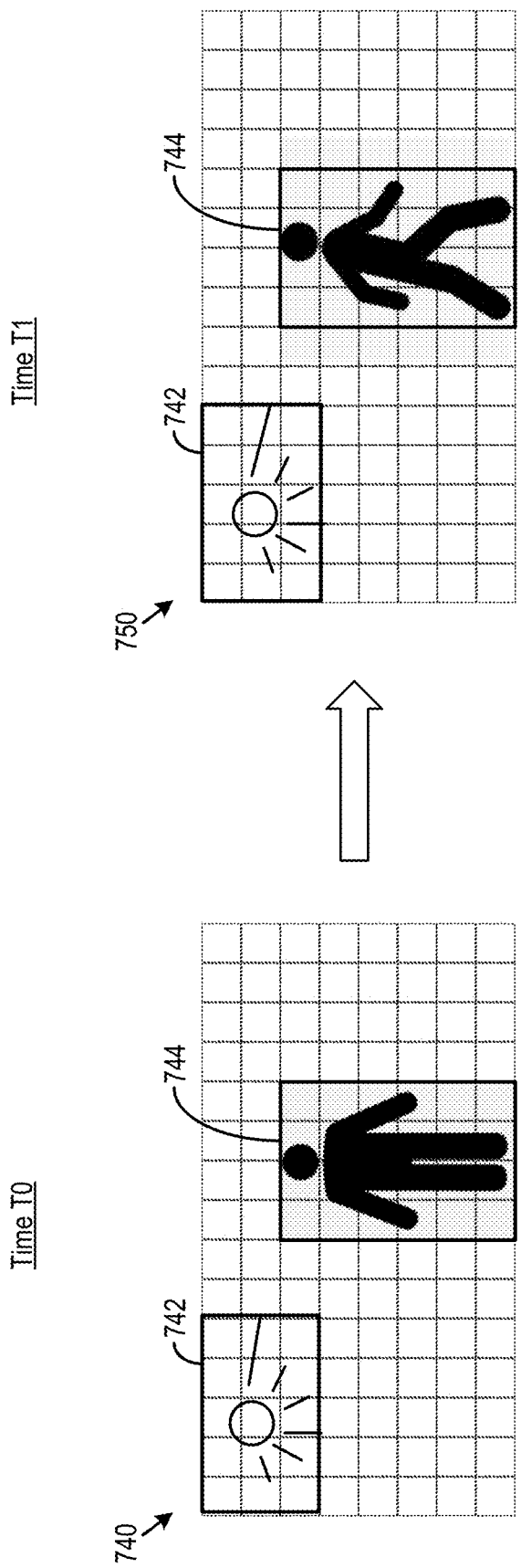

FIG. 7D illustrates an example of a dynamic vision sensing (DVS) operation on image frames from image sensor 600. In a DVS operation, image sensor 600 can output only pixels that experience a pre-determined degree of change in brightness (reflected in pixel values), while pixels that do not experience the degree of change are not output by image sensor 600. The DVS operation can be performed to detect a motion of an object and/or to reduce the volume of pixel data being output. For example, referring to FIG. 7D, at time T0 an image 740 is captured, which contains a group of pixels 742 of a light source and a group of pixels 744 of a person. Both group of pixels 742 and 744 can be output as part of image 740 at time T0. At time T1 an image 750 is captured. The pixel values of group of pixels 742 corresponding to the light source remain the same between times T0 and T1, and the group of pixels 742 is not output as part of image 750. On the other hand, the person changes from standing to walking between times T0 and T1, which results in changes in the pixel values of group of pixels 744 between times T0 and T1. As a result, the group of pixels 744 of the person are output as part of image 750.

In the operations of FIG. 7A-FIG. 7D, image sensor 600 can be controlled to perform a sparse capture operation, in which only a subset of pixel cells is selected to output pixel data of interest to the host processor. The pixel data of interest can include pixel data needed to support a particular operation at the host processor. For example, in the object tracking operation of FIG. 7A, image sensor 600 can be controlled to only transmit groups of pixels in ROIs 702 and 712 of object 704 in, respectively, image frames 700 and 710. In the object detection operation of FIG. 7B, image sensor 600 can be controlled to only transmit groups of pixels 726 and 728 of, respectively, vehicle 722 and person 724. In addition, in the eye-tracking operation of FIG. 7C, image sensor 600 can be controlled to only transmit groups of pixels 734 and 736 containing pupil 738 and glint 739. Further, in the DVS operation of FIG. 7D, image sensor 600 can be controlled to only transmit group of pixels 744 of the moving person at time T1 but not group of pixels 742 of the static light source. All these arrangements can allow generation and transmission of higher resolution images without corresponding increase in power and bandwidth. For example, a larger pixel cell array including more pixel cells can be included in image sensor 600 to improve image resolution, while the bandwidth and power required to provide the improved image resolution can be reduced when only a subset of the pixel cells generate the pixel data of interest at a high resolution and transmit the high resolution pixel data to the host processor, while the rest of the pixel cells are either not generating/transmitting pixel data, or generating/transmitting pixel data at a very low resolution. Moreover, while image sensor 600 can be operated to generate images at a higher frame rate, the increases in bandwidth and power can be reduced when each image only includes a small set of pixel values that are at high resolution and represented by a large number of bits, while the rest of the pixel values are either not transmitted, or are represented by a smaller number of bits.

The volume of pixel data transmission can also be reduced in the case of 3D sensing. For example, referring to FIG. 6D, an illuminator 640 can project a pattern 642 of structured light onto an object 650. The structured light can be reflected on a surface of an object 650, and a pattern 652 of reflected light can be captured by image sensor 600 to generate an image. Host processor can match pattern 652 with pattern 642 and determine the depth of object 650 with respect to image sensor 600 based on the image locations of pattern 652 in the image. For 3D sensing, only groups of pixel cells 660, 662, 664, and 666 contain relevant information (e.g., pixel data of pattern 652). To reduce the volume of pixel data being transmitted, image sensor 600 can be configured to send only the pixel data from groups of pixel cells 660, 662, 664, and 666, or to send the pixel data from groups of pixel cells 660, 662, 664, and 666 at a high resolution while the rest of the pixel data are at a low resolution, to the host processor.

Figure 8A:
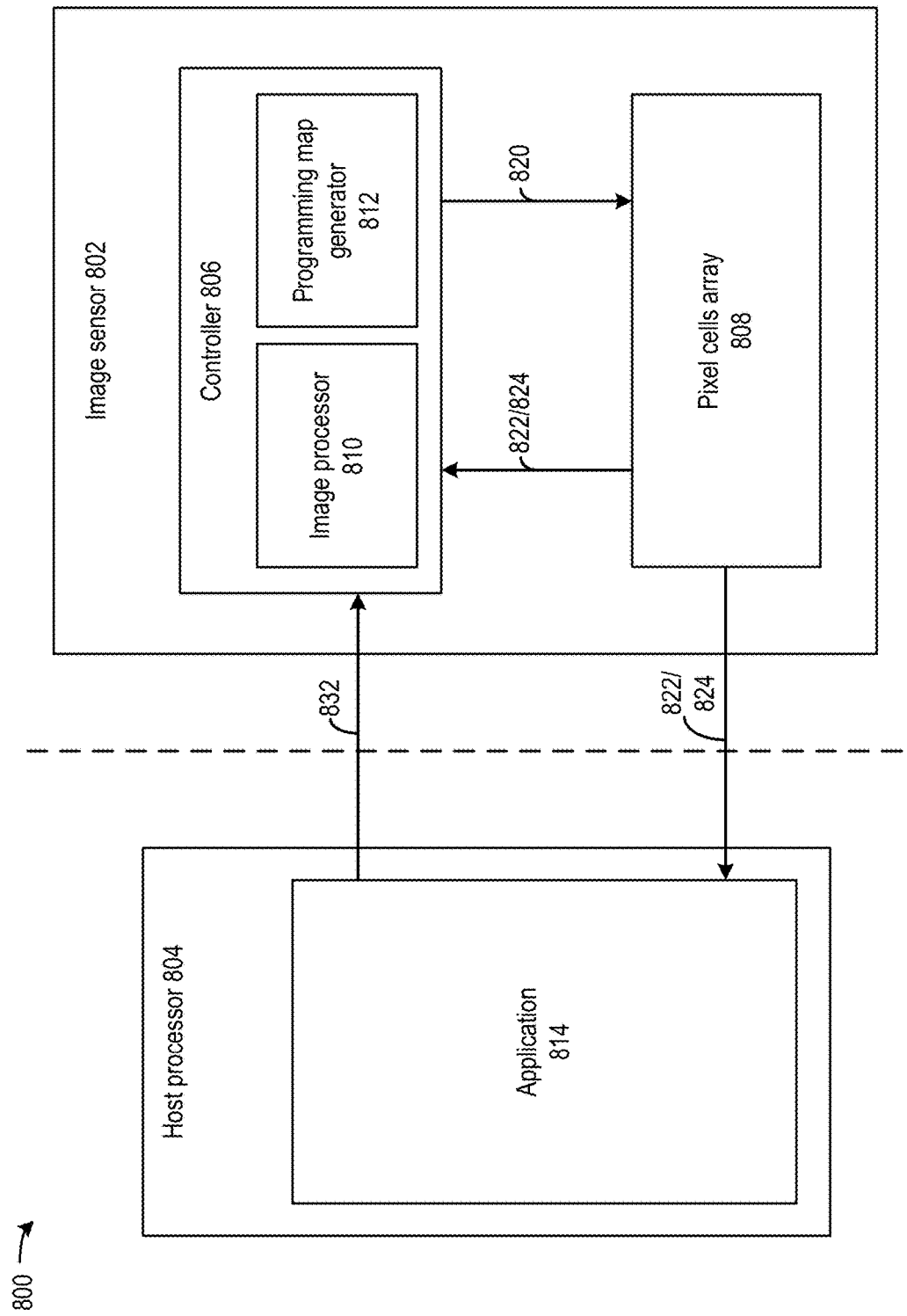
FIG. 8A and FIG. 8B illustrate examples of an imaging system and its operations.
Figure 8B:
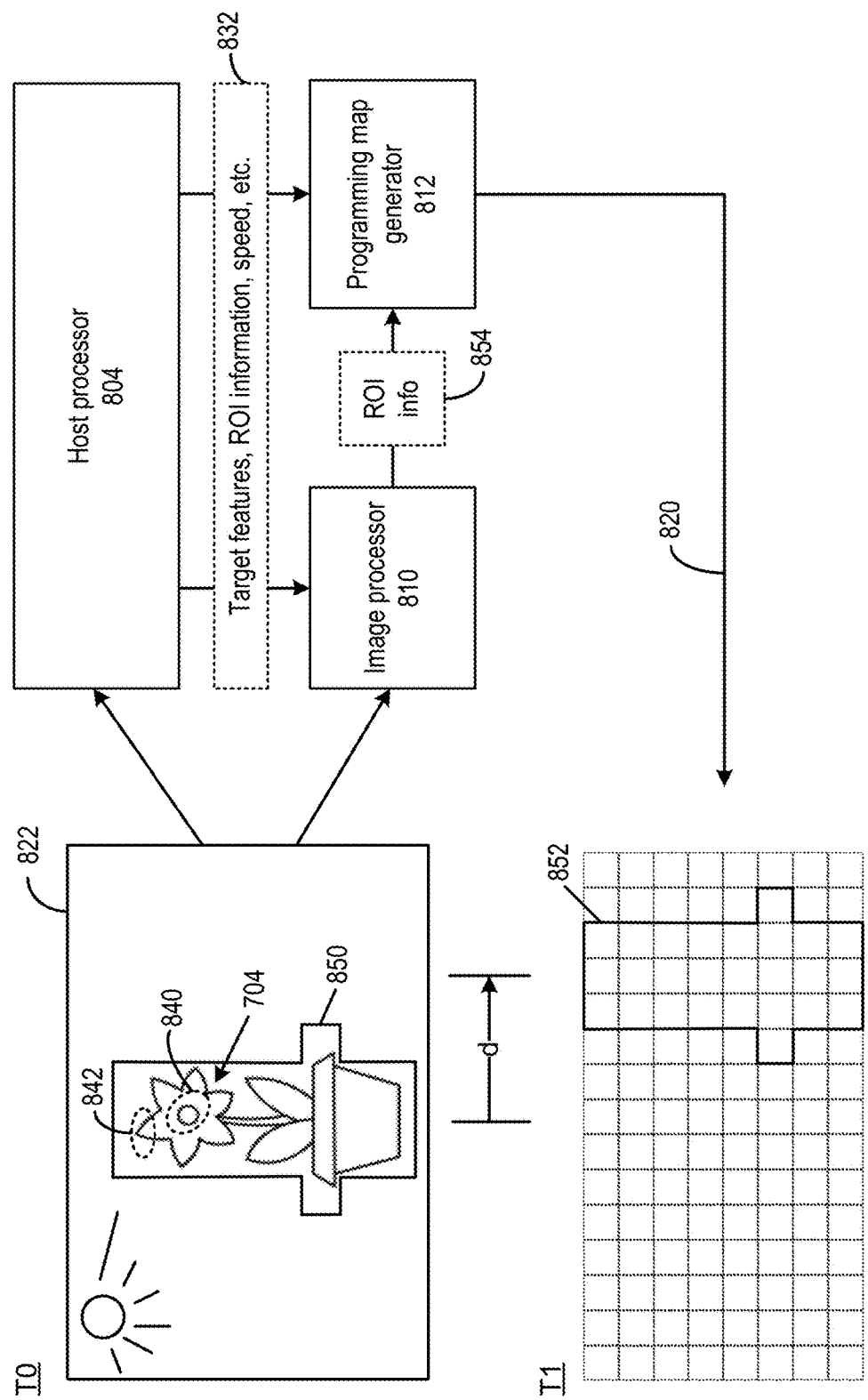

FIG. 8A and FIG. 8B illustrate examples of an imaging system 800 that can perform sparse capture operations to support the operations illustrated in FIG. 7A FIG. 7D. As shown in FIG. 8A, imaging system 800 includes an image sensor 802 and a host processor 804. Image sensor 802 includes a controller 806 and a pixel cell array 808. Controller 806 includes an image processor 810 and a programming map generator 812. In some examples, controller 806 can be implemented as an application specific integrated circuit (ASIC), a field programmable gate array (FPGA), or a hardware processor that executes instructions to implement the functions of image processor 810 and programming map generator 812. In addition, host processor 804 includes a general purpose central processing unit (CPU) which can execute an application 814.

Each pixel cell of pixel cell array 808, or blocks of pixel cells, can be individually programmable to, for example, enable/disable outputting of a pixel value, set a resolution of the pixel value output by the pixel cell, etc. Pixel cell array 808 can receive first programming signals 820, which can be in the form of a programming map that contains programming data for each pixel cell, from programming map generator 812 of controller 806. Pixel cell array 808 can sense light from a scene and generate a first image frame 822 of the scene and based on first programming signals 820. Specifically, pixel cell array 808 can be controlled by first programming signals 820 to operate in different sparsity modes, such as in a full-frame mode in which first image frame 822 includes a full image frame of pixels, and/or in a sparse mode in which first image frame 822 only includes a subset of the pixels specified by the programming map. Pixel cell array 808 can output first image frame 822 to both host processor 804 and to controller 806. In some examples, pixel cell array 808 can also output first image frame 822 with different pixel sparsity to host processor 804 and controller 806. For example, pixel cell array 808 can output first image frame 822 with a full image frame of pixels back to controller 806, and output first image frame 822 with sparse pixels defined by first programming signals 820 to host processor 804.

Controller 806 and host processor 804, together with image sensor 802, can form a two-tier feedback system based on first image frame 822 to control the image sensor to generate a subsequent image frame 824. In a two-tier feedback operation, image processor 810 of controller 806 can perform an image processing operation on first image frame 822 to obtain a processing result, and then programming map generator 812 can update first programming signals 820 based on the processing result. The image processing operation at image processor 810 can be guided/configured based on second programming signals 832 received from application 814, which can generate second programming signals 832 based on first image frame 822. Pixel cell array 808 can then generate subsequent image frame 824 based on the updated first programming signals 820. Host processor 804 and controller 806 can then update, respectively, first programming signals 820 and second programming signals 832 based on the subsequent image frame 824.

In the aforementioned two-tier feedback system, second programming signals 832, from host processor 804, can be in the form of a teaching/guidance signal, the result of a neural network training operation (e.g., backward propagation results), etc., to influence the image processing operation and/or programming map generation at controller 806. Host processor 804 can generate the teaching/guidance signal based on not just the first image frame but also other sensor data (e.g., other image frames captured by other image sensors, audio information, motion sensor outputs, inputs from the user) to determine a context of the light sensing operation by image sensor 802, and then determine the teaching/guidance signal. The context may include, for example, an environment condition image sensor 802 operates in, a location of image sensor 802, or any other requirements of application 814. The teaching/guidance signals can be updated at a relatively low rate (e.g., lower than the frame rate) based on the context, given that the context typically changes at a much lower rate than the frame rate, while the image processing operation and the updating of the programming map at controller 806 can occur at a relatively high rate (e.g., at the frame rate) to adapt to the images captured by pixel cell array 808.

Although FIG. 8A illustrates that pixel cell array 808 transmits first image frame 822 and second image frame 824 to both host processor 804 and controller 806, in some cases pixel cell array 808 may transmit image frames of different sparsity to host processor 804 and controller 806. For example, pixel cell array 808 can transmit first image frame 822 and second image frame 824 having full pixels to image processor 810, while a sparse version of both image frames, each including subsets of pixels selected based on first programming signals 820, are sent to host processor 804.

FIG. 8B illustrates an example of an operation of imaging system 800 to support the object tracking operation of FIG. 7A. Specifically, at time T0, pixel cell array 808 (not shown in FIG. 8B) generates first image frame 822 including full pixels of a scene including object 704, based on first programming signals 820 indicating that a full frame of pixels is to be generated, and transmits first image frame 822 to both host processor 804 and image processor 810. Host processor 804, based on executing an application 814, can determine that object 704 is to be tracked. Such determination can be based on, for example, a user input, a requirement by application 814, etc. Host processor 804 can also process first image frame 822 to extract spatial features of object 704, such as features 840 and 842. Based on the processing result, host processor 804 can determine an approximate location, size, and shape of a region of interest (ROI) 850 that includes pixels of object 704 (or other objects, such as pupil 738 and glint 739 of FIG. 7C) in first image frame 822. In addition, based on other outputs from other sensors (e.g., IMU), host processor 804 also determines that image sensor 802 is moving relative to object 704 at a certain speed, and can estimate the new location of an ROI 852 in a subsequent image frame.

Host processor 804 can then transmit, as part of second programming signals 832, the target features of object 704 (e.g., features 840 and 842), information of ROI (e.g., initial location, shape, size, etc. of ROI 850), speed, etc., to image processor 810 and programming map generator 812.

Based on second programming signals 832, image processor 810 can process first image frame 822 to detect the target image features of object 704, and determine the precise location, size, and shape of ROI 852 based on the detection result. Image processor 810 can then transmit ROI information 854 including the precise location, size, and shape of ROI 850 in first image frame 822 to programming map generator 812. Based on ROI information 854, as well as second programming signals 832, programming map generator 812 can estimate the expected location, size, and shape of ROI 852 in a subsequent image frame to be captured at time T1. For example, based on the speed information included in second programming signals 832, programming map generator 812 can determine that ROI 850 will have moved by a distance of d between times T0 and T1 to become ROI 852, and determine the location of ROI 852 at time T1 based on the distance d. As another example, in a case where pupil 738 and glint 739 of FIG. 7C is being tracked as part of an eye-tracking operation, programming map generator 812 can obtain information about a gaze change of the user, and determine an expected location of an ROI (e.g., ROI 852) including pupil 738 and glint 739 at time T1 based on the gaze change. Programming map generator 812 can then update first programming signals 820 to select pixel cells within ROI 852, at time T1, to output pixel data of object 704 (or pupil 738 and glint 739, or other objects) for the subsequent image frame.

Figure 9A:
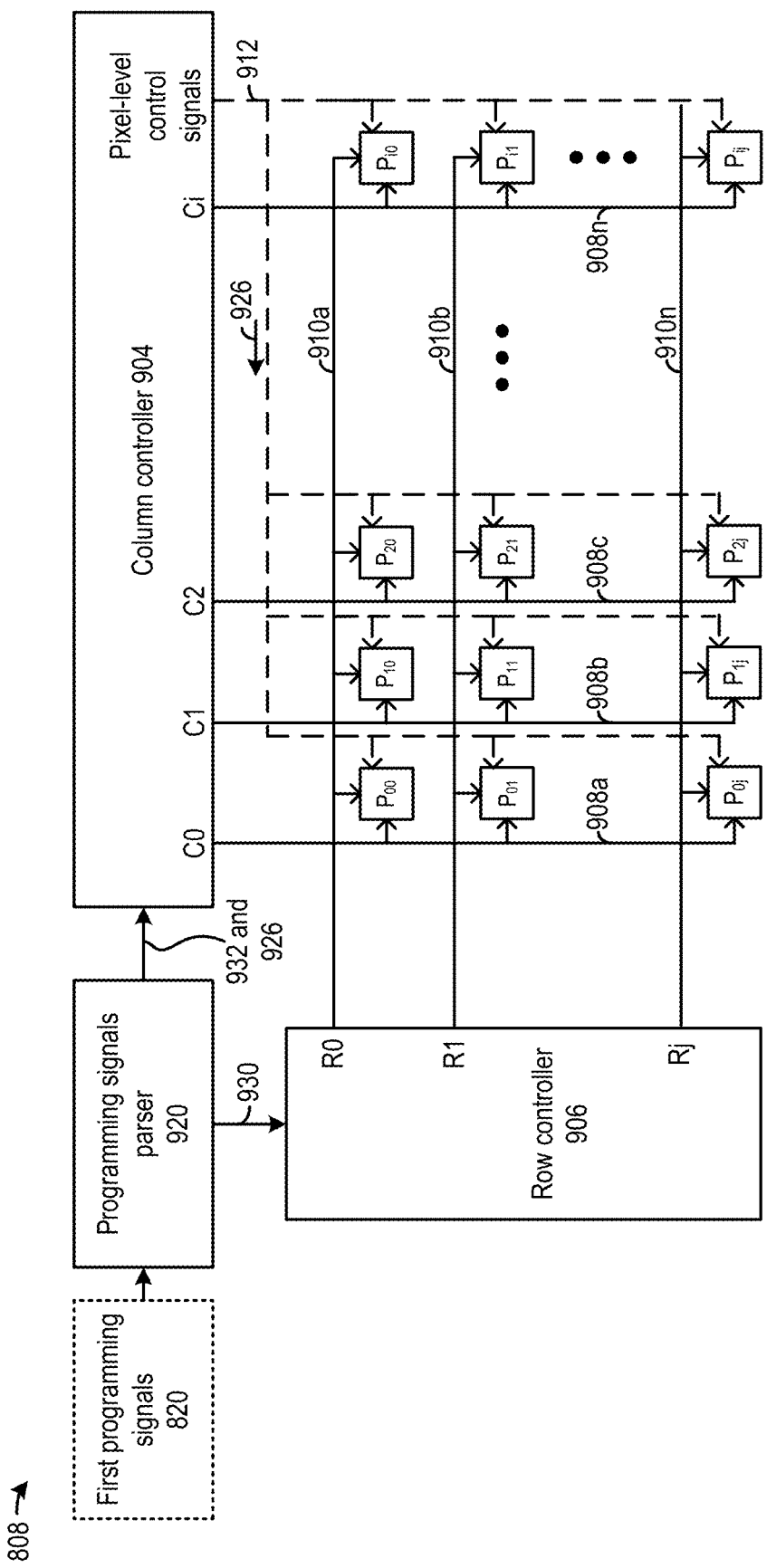
FIG. 9A, FIG. 9B, FIG. 9C, and FIG. 9D illustrate examples of components of the imaging system of FIG. 8A and FIG. 8B.

FIG. 9A, FIG. 9B, FIG. 9C, and FIG. 9D illustrate examples of internal components of imaging system 800 of FIG. 8A. FIG. 9A illustrates an example of pixel cell array 808. As shown in FIG. 9A, pixel cell array 808 may include a column controller 904, a row controller 906, and a programming signals parser 920. Column controller 904 is connected with column buses 908 (e.g., 908a, 908b, 908c, . . . 908n), whereas row controller 906 is connected with row buses 910 (e.g., 910a, 910b, . . . 908n). One of column controller 904 or row controller 906 is also connected with a programming bus 912 to transmit pixel-level programming signals 926 targeted at a particular pixel cell or a group of pixel cells. Each box labelled $P_{00}$, $P_{01}$, $P_{0j}$, etc. can represent a pixel cell or a group of pixel cells (e.g., a group of 2×2 pixel cells). Each pixel cell or group of pixel cells can be connected to one of column buses 908, one of row buses 910, programming bus 912, and an output data bus to output pixel data (not shown in FIG. 9A). Each pixel cell (or each group of pixel cells) is individually addressable by column address signals 930 on column buses 908 provided by column controller 904, and row address signals 932 on row buses 910 provided by row controller 906, to receive pixel-level programming signals 926 via pixel-level programming bus 912 at a time. Column address signals 930, row address signals 932, as well as pixel-level programming signals 926, can be generated based on first programming signals 820 from programming map generator 812.

Figure 9B:
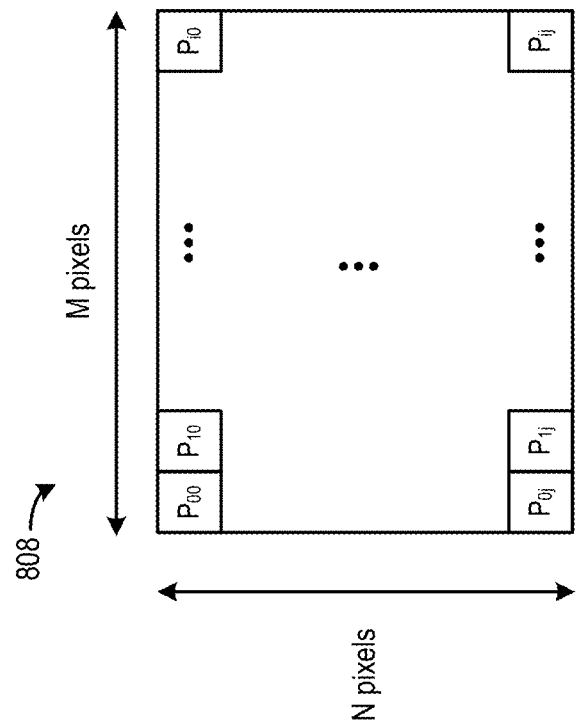
Figure 9B:
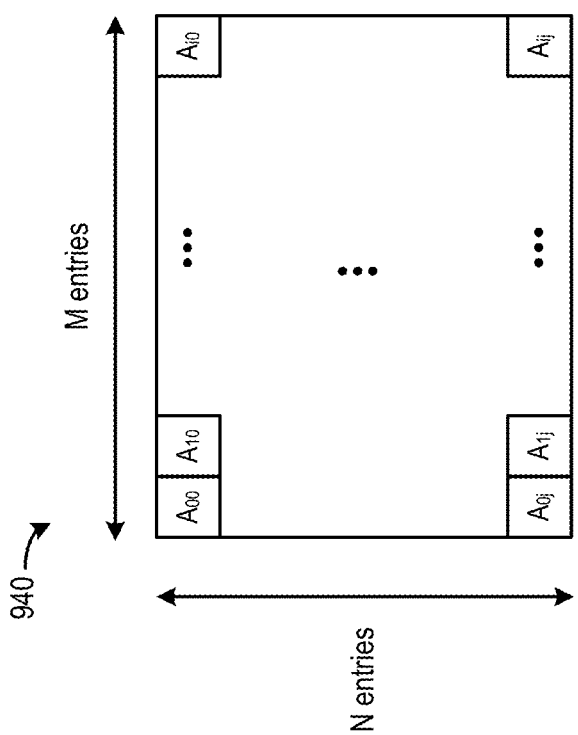

In addition, FIG. 9A includes programming signals parser 920 which can extract pixel-level programming signals from first programming signals 820. In some examples, first programming signals 820 can include a programming map which can include programming data for each pixel cell or each group of pixel cells of pixel cell array 808. FIG. 9B illustrates an example of pixel array programming map 940. As shown in FIG. 9B, pixel array programming map 940 can include a two-dimensional array of pixel-level programming data, with each pixel-level programming data of the two-dimensional array targeted at a pixel cell or a group of pixel cells of pixel cell array 808. For example, in a case where each pixel-level programming datum is targeted at a pixel cell, and assuming pixel cell array 808 has a width of M pixels (e.g., M columns of pixels) and a height of N pixels (e.g., N rows of pixels), pixel array programming map 940 can also have a width of M entries (e.g., M columns of entries) and a height of N entries (e.g., N rows of entries), with each entry storing pixel-level programming data for a corresponding pixel cell. For example, the pixel-level programming data $A_{00}$ at entry (0, 0) of pixel array programming map 940 is targeted at pixel cell $P_{00}$ at pixel location (0, 0) of pixel cell array 808, whereas the pixel-level programming data $A_{01}$ at entry (0, 1) of pixel array programming map 940 is targeted at pixel cell $P_{01}$ at pixel location (0, 1) of pixel cell array 808. In a case where pixel-level programming data is targeted at a group of pixel cells, the number of entries of pixel array programming map 940 along the height and the width can be scaled based on a number of pixel cells in each group.

Pixel array programming map 940 can be configured to support the feedback operations described in FIG. 9B. For example, the pixel-level programming data stored at each entry can individually program each pixel cell (or each group of pixel cells) to, for example, power on or off, to enable or disable outputting of pixel data, to set a quantization resolution, to set a precision of output pixel data, to select a quantization operation (e.g., one of TTS, FD ADC, PD ADC), to set a frame rate, etc. As described above, programming map generator 812 can generate pixel array programming map 940 based on, for example, prediction of one or more ROIs, in which the pixel-level programming data for pixel cells within an ROI are different from the pixel-level programming data for pixel cells outside the ROI. For example, pixel array programming map 940 can enable a subset of pixel cells (or groups of pixel cells) to output pixel data, while the rest of the pixel cells do not output pixel data. As another example, pixel array programming map 940 can control a subset of pixel cells to output pixel data at a higher resolution (e.g., using a larger number of bits to represent each pixel), whereas the rest of pixel cells output pixel data at a lower resolution.

Referring back to FIG. 9A, programming map parser 920 can parse pixel array programming map 940, which can be in a serial data stream, to identify the pixel-level programming data for each pixel cell (or each group of pixel cells). The identification of the pixel-level programming data can be based on, for example, a pre-determined scanning pattern by which the two-dimensional pixel array programming map is converted into the serial format, as well as the order by which the pixel-level programming data is received by programming signals parser 920 from the serial data stream. For each entry of programming data, programming signals parser 920 can generate a row address signal 930 and a column address signal 832, and transmit row address signal 830 and column address signal 832 to, respectively, row controller 806 and column controller 904 to select a pixel cells and transmit pixel-level programming signals 826 to the selected pixel cell (or group of pixel cells).

Figure 9C:
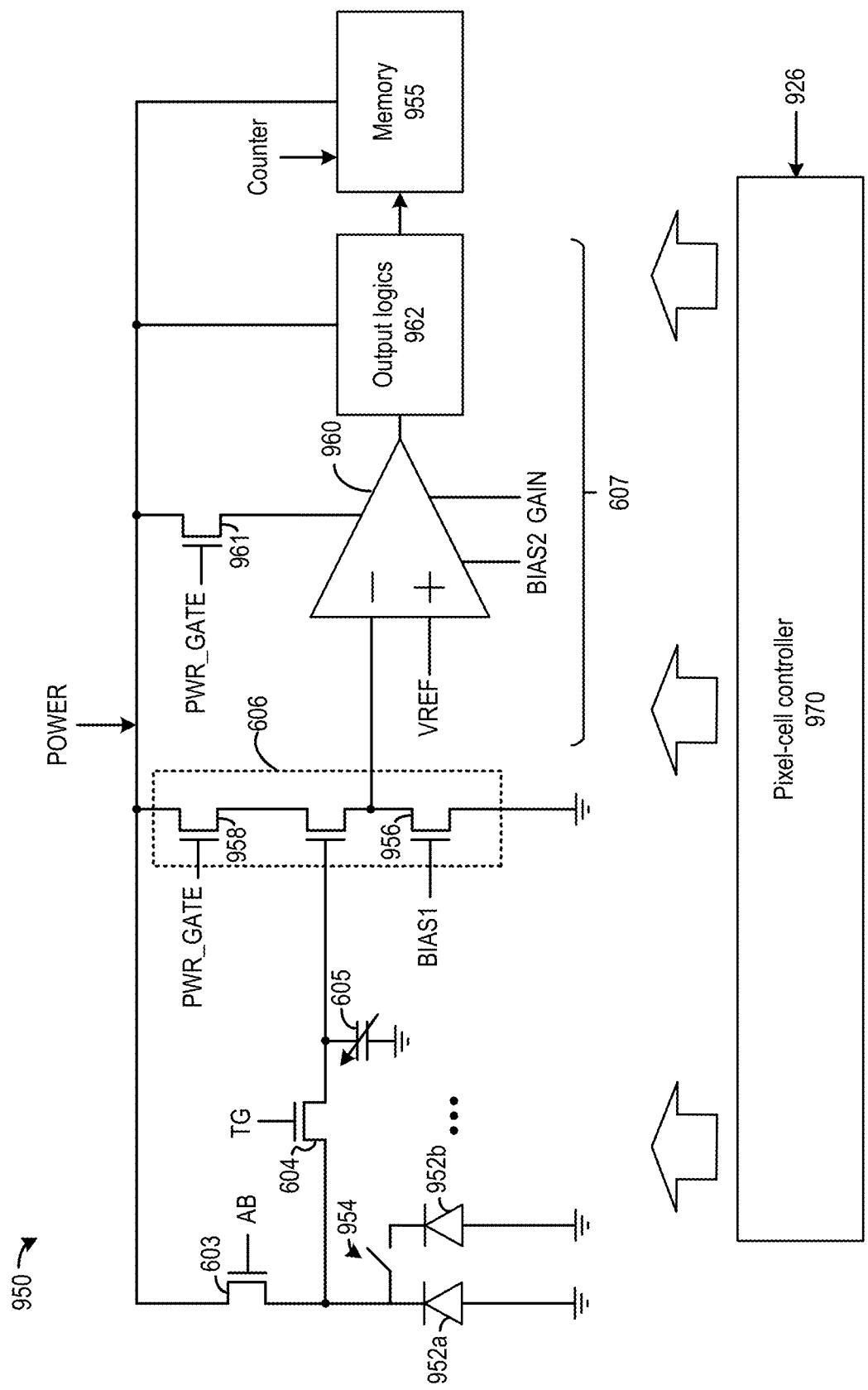

FIG. 9C illustrates example internal components of a pixel cell 950 of pixel cell array 808, which can include at least some of the components of pixel cell 601 of FIG. 6A. Pixel cell 950 can include one or more photodiodes, including photodiodes 952a, 952b, etc., each can be configured to detect light of a different frequency range. For example, photodiode 952a can detect visible light (e.g., monochrome, or one of red, green, or blue color), whereas photodiode 952b can detect infra light. Pixel cell 950 further includes a switch 954 (e.g., a transistor, a controller barrier layer) to control which photodiode outputs charge for pixel data generation.

In addition, pixel cell 950 further includes electronic shutter switch 603, transfer switch 604, charge storage device 605, buffer 606, quantizer 607 as shown in FIG. 6A, as well as a memory 955. Charge storage device 605 can have a configurable capacitance to set a charge-to-voltage conversion gain. In some examples, the capacitance of charge storage device 605 can be increased to store overflow charge for FD ADC operation for a medium light intensity to reduce the likelihood of charge storage device 605 being saturated by the overflow charge. The capacitance of charge storage device 605 can also be decreased to increase the charge-to-voltage conversion gain for PD ADC operation for a low light intensity. The increase in the charge-to-voltage conversion gain can reduce quantization error and increase the quantization resolution. In some examples, the capacitance of charge storage device 605 can also be decreased during the FD ADC operation to increase the quantization resolution. Buffer 606 includes a current source 956 of which the current can be set by a bias signal BIAS1, as well as a power gate 958 which can be controlled by a PWR_GATE signal to turn on/off buffer 606. Buffer 606 can be turned off as part of disabling pixel cell 950.

In addition, quantizer 607 includes a comparator 960 and output logics 962. Comparator 960 can compare the output of buffer with a reference voltage (VREF) to generate an output. Depending on a quantization operation (e.g., TTS, FD ADC, and PD ADC operations), comparator 906 can compare the buffered voltage with different VREF voltages to generate the output, and the output be further processed by output logics 962 to cause memory 955 to store a value from a free running counter as the pixel output. The bias current of comparator 960 can be controlled by a bias signal BIAS2 which can set the bandwidth of comparator 960, which can be set based on the frame rate to be supported by pixel cell 950. Moreover, the gain of comparator 960 can be controlled by a gain control signal GAIN. The gain of comparator 960 can be set based on a quantization resolution to be supported by pixel cell 950. Comparator 960 further includes a power switch 961 which can also be controlled by the PWR_GATE signal to turn on/off comparator 960. Comparator 960 can be turned off as part of disabling pixel cell 950.

In addition, output logics 962 can select the outputs of one of the TTS, FD ADC, or PD ADC operations and based on the selection, determine whether to forward the output of comparator 960 to memory 955 to store the value from the counter. Output logics 962 can include internal memory to store indications, based on the output of comparator 960, of whether the photodiode 952 (e.g., photodiode 952a) is saturated by the residual charge, and whether charge storage device 605 is saturated by the overflow charge. If charge storage device 605 is saturated by the overflow charge, output logics 962 can select TTS output to be stored in memory 955 and prevent memory 955 from overwriting the TTS output by the FD ADC/PD ADC output. If charge storage device 605 is not saturated but the photodiodes 952 are saturated, output logics 962 can select the FD ADC output to be stored in memory 955; otherwise output logics 962 can select the PD ADC output to be stored in memory 955. In some examples, instead of the counter values, the indications of whether photodiodes 952 are saturated by the residual charge and whether charge storage device 605 is saturated by the overflow charge can be stored in memory 955 to provide the lowest precision pixel data.

In addition, pixel cell 950 may include a pixel-cell controller 970, which can include logic circuits to generate control signals such as AB, TG, BIAS1, BIAS2, GAIN, VREF, PWR_GATE, etc. Pixel-cell controller 970 can also be programmed by pixel-level programming signals 926.

For example, to disable pixel cell 950, pixel-cell controller 970 can be programmed by pixel-level programming signals 926 to de-assert PWR_GATE to turn off buffer 606 and comparator 960. Moreover, to increase the quantization resolution, pixel-cell controller 970 can be programmed by pixel-level programming signals 926 to reduce the capacitance of charge storage device 605, to increase the gain of comparator 960 via GAIN signal, etc. To increase the frame rate, pixel-cell controller 970 can be programmed by pixel-level programming signals 926 to increase BIAS1 signal and BIAS2 signal to increase the bandwidth of, respectively, buffer 606 and comparator 960. Further, to control the precision of pixel data output by pixel cell 950, pixel-cell controller 970 can be programmed by pixel-level programming signals 926 to, for example, connect only a subset of bits (e.g., most significant bits) of the counter to memory 955 so that memory 955 only stores the subset of bits, or to store the indications stored in output logics 962 to memory 955 as the pixel data. In addition, pixel-cell controller 970 can be programmed by pixel-level programming signals 926 to control the sequence and timing of AB and TG signals to, for example, adjust the exposure period and/or select a particular quantization operation (e.g., one of TTS, FD ADC, or PD ADC) while skipping the others based on the operation condition, as described above.

Figure 9D:
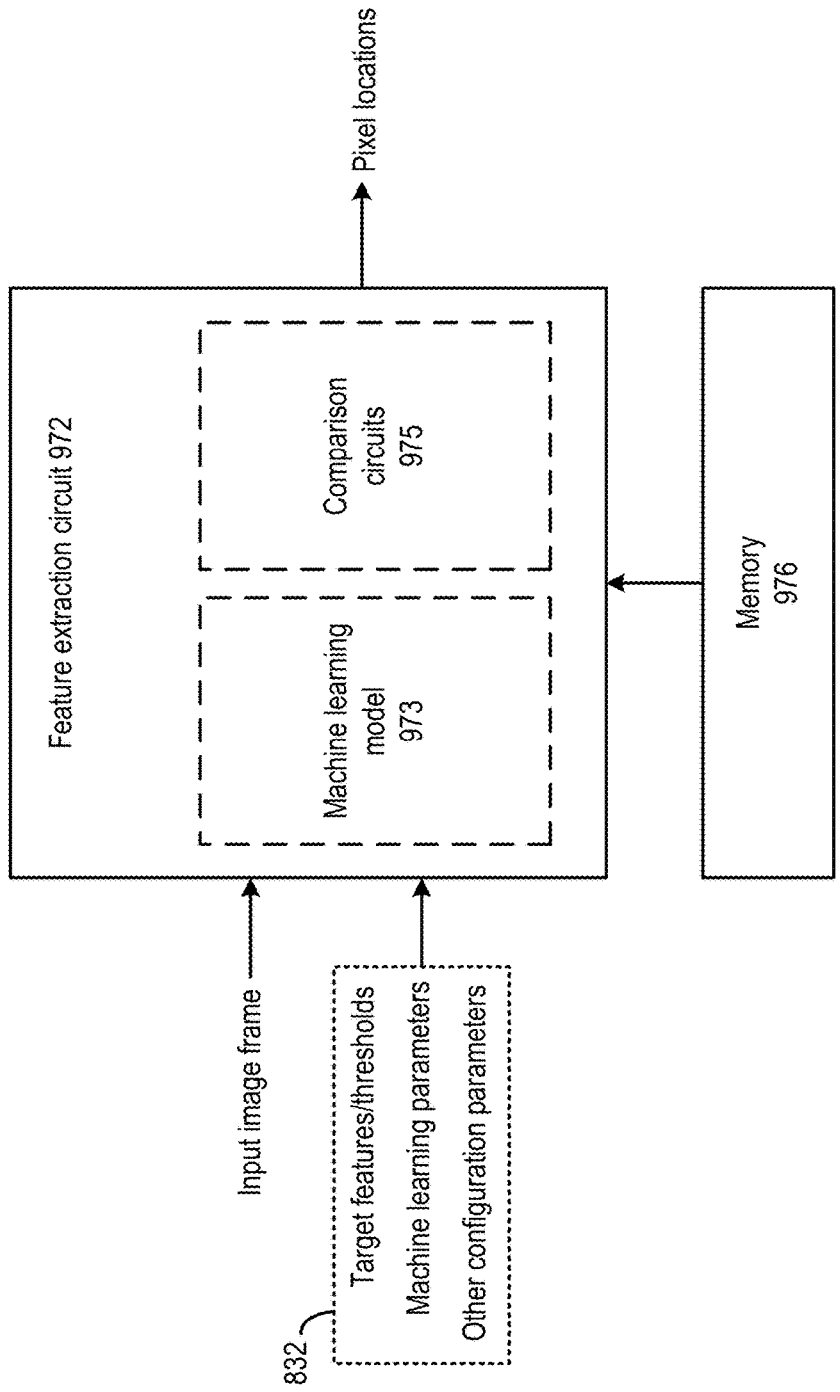

FIG. 9D illustrates examples of internal components of image processor 810. As shown in FIG. 9D, image processor 810 may include a feature extraction circuit 972 and a memory 976. The features to be extracted/detected by image processor 810 may include, for example, spatial features and keypoints of pre-determined objects (e.g., a human face, a body part, certain physical objects in a scene), temporal contrasts, etc. In some examples, feature extraction circuit 972 may implement a machine-learning model 973, such as a convolutional neural network (CNN), a recurring neural network (RNN), etc, which can be trained to perform image feature operations on an input image frame (e.g., first image frame 822) generated by pixel cell array 808. In some examples, feature extraction circuit 972 can also include comparison circuits 975 to compare the pixel data against a threshold to identify pixels having pre-determined temporal contrasts. Feature extraction circuit 972 may include other circuits, such as a digital signal processor (DSP), a linear solver unit, a micro-controller, arithmetic circuits, etc., to perform the feature extraction operation. Image processor 810 may receive, as part of second programming signals 832 from host processor 804, target features/thresholds, machine-learning parameters (e.g., weights, backward propagation gradients), or other configuration parameters, to support the feature extraction operations and/or training operations of machine-learning model 973. As a result of the feature extraction operation, feature extraction circuit 972 may output, for example, pixel locations of the detected features in the input image frame, which can then be fed to programming map generator 812 to generate pixel array programming map 940.

In addition, memory 976 can provide an on-chip memory to store pixel data of the input image frame, various configuration data for the feature extraction operation, as well as the output of feature extraction circuit 972 (e.g., pixel locations). In some examples, a current input image frame provided to feature extraction circuit 972 may include only sparse pixel data rather than a full frame of pixel data. In such a case, memory 976 may also store pixel data of prior input image frames, which can be fed to feature extraction circuit 972 and combined with the current input image to generate a reconstructed full frame of pixel data. Feature extraction circuit 972 can then perform the feature extraction operation based on the reconstructed full frame of pixel data. Memory 976 may include, for example, spin tunneling random access memory (STRAM), non-volatile random access memory (NVRAM), etc. In some examples, image processor 810 may also include an interface to an off-chip memory (e.g., dynamic random access memory) to support the feature extraction operations at feature extraction circuit 880.

Feature extraction circuit 972 can employ various techniques to perform the feature extraction operation. In one example, feature extraction circuit 972 can use machine-learning model 973, such as a CNN, to perform a convolution operation between a block of pixel data with a filter. The filter may include a set of weights representing a target feature to be extracted.

As part of the convolution operation, the filter is superimposed with a portion of the block of pixel data at a particular stride location, and a sum of products of each element of the filter and each pixel within the portion can be determined. As the filter is shifted around within the block of pixels, a distribution of the sum of products with respect to different stride locations can be determined as the convolution outputs. The convolution outputs may indicate, for example, a probability that a particular pixel captures the target feature, a probability that the pixel belongs to a target object, etc. Based on the probabilities, feature extraction circuit 972 can output the pixel locations of the pixels that are determined to be likely to include the target feature(s) or to be part of the target object. The pixel locations can then be output as part of ROI information 852 of FIG. 8B to adjust the sparse capture operation of pixel cell array 808 as described above.

The filter weights of the convolution operation can be obtained from a training process, which can be performed off-line, on-line, or a combination of both. In an off-line training process, the weights can be pre-stored in memory 976 prior to the feature extraction operation. The weights can be obtained from a training process based on a training data set that cover a range of image data expected to be processed by image processor 810. The training data set can be stored in a cloud environment, and the training can also be performed in the cloud environment as an off-line training process. The weights obtained from the off-line training process can be common for all image processors 810 of different imaging systems 800.

In an on-line training process, the weights used by image processor 810 can be obtained while image processor 810 receives image data of the actual object to be detected. An example application may be eye tracking (e.g., based on images of an eye captured by the image sensor). As part of the on-line training process, image processor 810 can operate in a training mode in which it receives pixel data of the eye of the user when the user is asked to look at specific targets or locations in space. Through the training process, image processor 810 can adjust the weights to maximize the likelihood of correctly identifying the eye of the user. In such a case, the weights used by image processor 810 of a particular imaging system 800 can be different from the weights used by image processor 810 of another imaging system 800, as the weights are optimized for a specific user and/or for a specific operation condition. In some examples, the weights used by image processor 810 can be obtained by a combination of off-line and on-line training processes. For example, the weights used by the first neural network layer can be generic weights used to extract generic features of an object, whereas the weights of the upper neural network layers can be trained in an on-line training process to become specific to a user and/or to a specific operation condition.

In addition, to support a dynamic vision sensing (DVS) operation, feature extraction circuit 972 can use comparison circuits 975 to compare the pixels in the input image frame with corresponding pixels in the prior image frame stored in memory 976 to obtain temporal contrasts for the pixels. Comparison circuits 975 can also compare the temporal contrasts against a target threshold (received as part of second programming signals 832) to output the pixel locations of pixels having (or exceeding) a pre-determined threshold of temporal contrast.

The feature extraction operation at feature extraction circuit 972 can be configured based on second programming signals 832. For example, host processor 804 can encode the target features to be extracted as filter weights, and supply the filter weights to the CNN model to perform convolution operations. In addition, host processor 804 can set the temporal contrast thresholds for the DVS operation, and send the temporal contrast thresholds as part of second programming signals 832. The pixel locations can then be output as part of ROI information 852 of FIG. 8B to adjust the sparse capture operation of pixel cell array 808 as described above.

Besides target features and thresholds, host processor 804 can influence the feature extraction operation at feature extraction circuit 972 based on other configuration parameters included in second programming signals 832. For example, host processor 804 can be part of the on-line training operation and can determine the backward propagation gradients, based on a training operation involving images received from a single imaging system 800 or multiple imaging systems 800. Host processor 804 can then provide the backward propagation gradients back to each imaging system 800 as part of second programming signals 832 to adjust the weights locally at each imaging system. As another example, host processor 804 can provide the intermediate result of the image processing operation, such as the outputs of lower level neural network layers, as part of second programming signals 832 to feature extraction circuit 972, which can then use the outputs to perform the neural network computations at the higher level neural network layers. As another example, host processor 804 can provide a predicted accuracy of the image processing operation performed by the neural network as feedback, which allows the neural network of feature extraction circuit 972 to update the weights to improve the predicted accuracy of the image processing operation.

As another example, host processor 804 can provide the locations of an initial ROI (e.g., ROI 850 of FIG. 8B). Image processor 810 can perform the feature extraction operation (e.g., convolution operation, dynamic sensing operation) in a two-step process. For example, image processor 810 can first perform a feature extraction operation on pixels identified by the initial ROI. If the extraction results indicate that the initial ROI is off (e.g., the identified pixels do not resemble the shape of the target object), image processor 810 can use the initial ROI as a baseline to search for additional pixels that may include the target features in a second step. At the end of the second step, image processor 810 can determine the refined pixel locations to provide a more refined ROI.

In addition, host processor 804 can also perform an evaluation of the feature extraction operation, and provide the evaluation result back to feature extraction circuit 972. Host processor 804 can provide the evaluation result as a feedback to influence the feature extraction operation at feature extraction circuit 972. The evaluation result can include, for example, an indication of whether (and/or a percentage of) the sparse pixels output by pixel cell array 808 contain the data needed by application 814. In a case where the sparse pixels are output based on an ROI defined in first programming signals 820 generated as a result of the feature extraction operation, feature extraction circuit 972 can adjust the ROI and/or the feature extraction operation based on the evaluation result. For example, in a case of object tracking/detection operation, host processor 804 can evaluate whether the sparse pixels in an image frame output by pixel cell array 808 contain all the pixels of the target object, and provide the evaluation result back to feature extraction circuit 972. Feature extraction circuit 972 can then adjust, for example, the selection of pixels to perform the feature extraction operation based on the evaluation result. In a case where the evaluation result indicate that the sparse pixels do not contain all the pixels of the target object, feature extraction circuit 972 can expand the ROI to process more pixels, or even forgo the ROI and process all pixels of the input image frame, to extract/detect the target features.

Figure 10A:
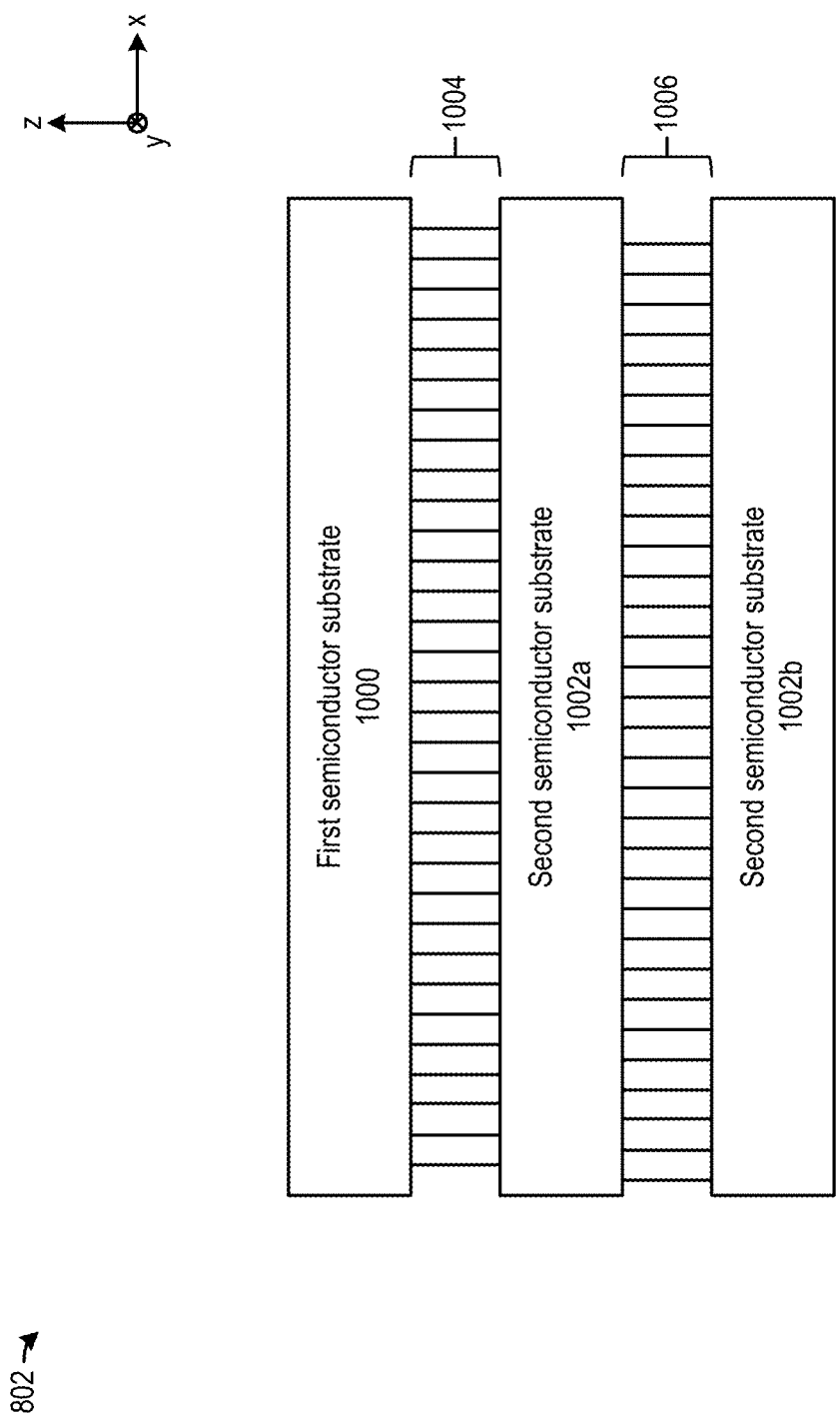
FIG. 10A, FIG. 10B, and FIG. 10C illustrate example physical arrangements of the imaging system of FIG. 8A-FIG. 9D.
Figure 10B:
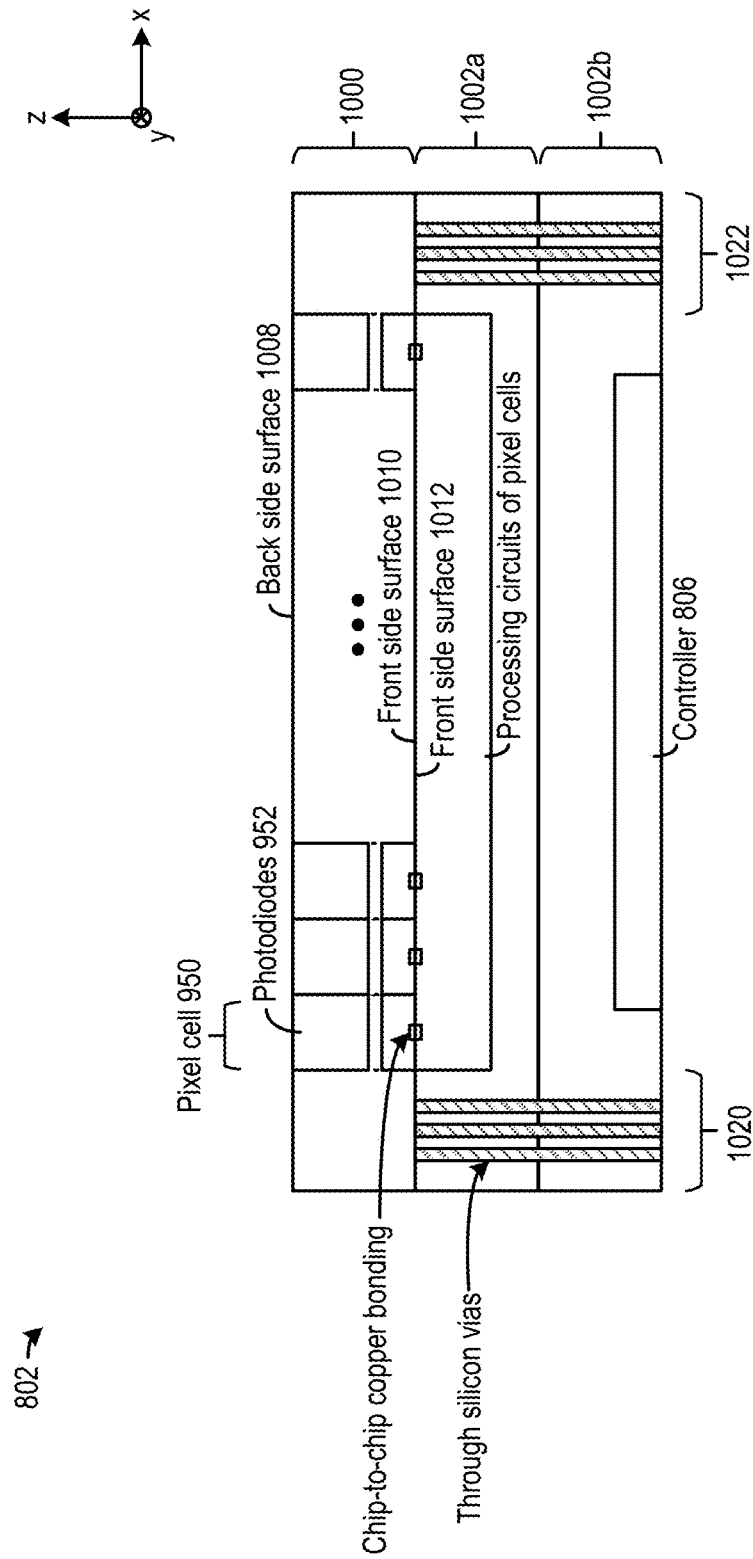
Figure 10C:
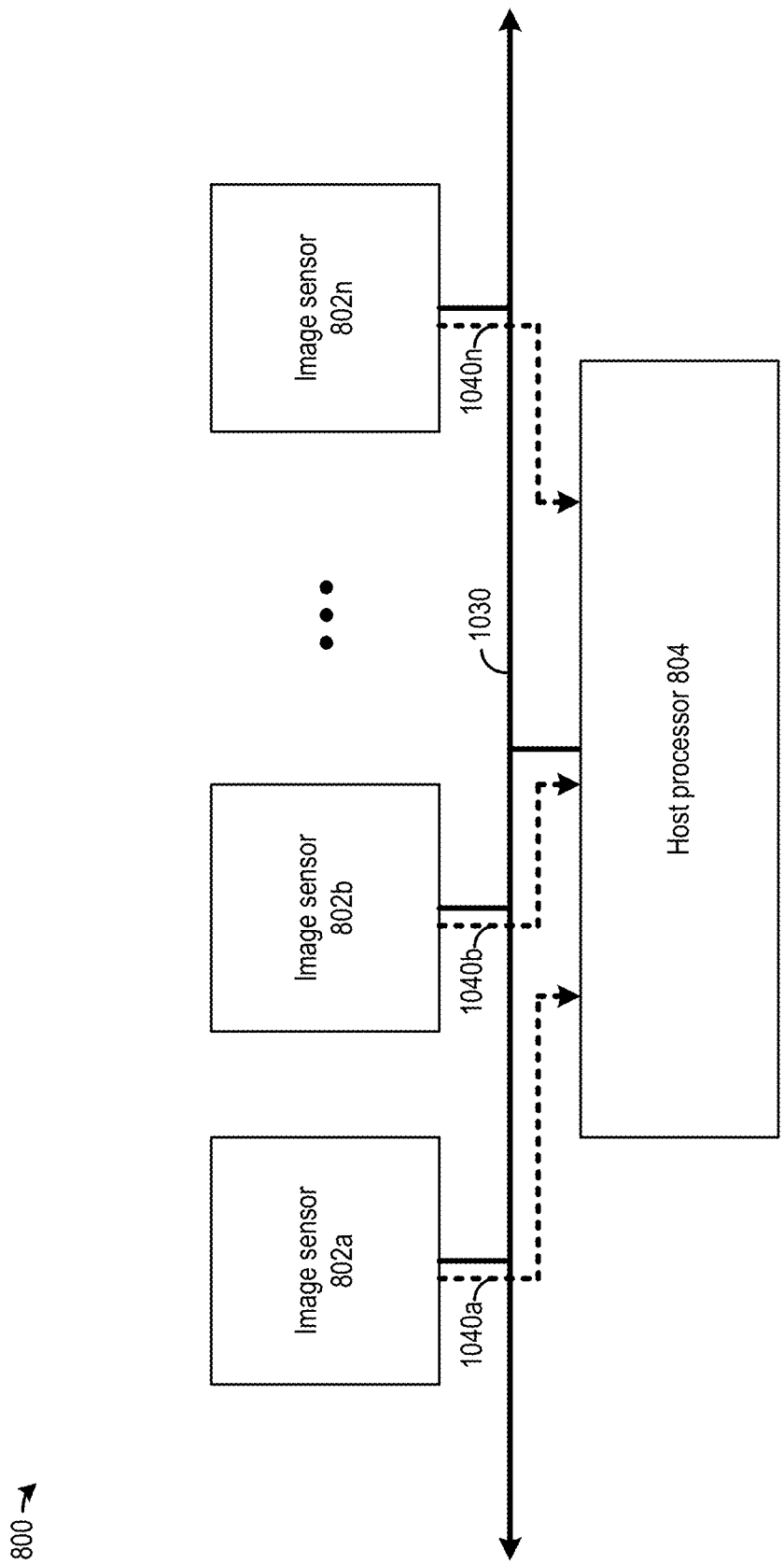

FIG. 10A, FIG. 10B, and FIG. 10C illustrate examples of physical arrangements of image sensor 802 and host processor 804 in imaging system 800. FIG. 10A and FIG. 10B illustrate examples of physical arrangements of controller 806 and pixel cell array 808. As shown in FIG. 10A, image sensor 802 may include a first semiconductor substrate 1000 that includes some of the components of pixel cell array 808, such as photodiodes of the pixel cells, and one or more second semiconductor substrates 1002 that include the processing circuits of pixel cell array 808, such as buffer 606, quantizer 607, and memory 955, as well as controller 806. In some examples, one or more second semiconductor substrates 1002 includes a second semiconductor substrate 1002*a* and a second semiconductor substrate 1002*b*. Second semiconductor substrate 1002*a* can include the processing circuits of the pixel cell array 808, whereas second semiconductor substrate 1002*b* can include controller 806.

In some examples, first semiconductor substrate 1000 and one or more second semiconductor substrates 1002 can form a stack along a vertical direction (e.g., represented by z-axis), with vertical interconnects 1004 and 1006 to provide electrical connection among the substrates. Such arrangements can reduce the routing distance of the electrical connections between pixel cell array 808 and controller 806, which can increase the speed of transmission of data (especially pixel data) from pixel cell array 808 to controller 806 and reduce the power required for the transmission.

FIG. 10B illustrates examples of details of the stack structure of image sensor 802. As shown in FIG. 10B, first semiconductor substrate 1000 may include a back side surface 1008 configured as a light receiving surface and includes photodiodes of each pixel cell, and a front side surface 1010 on which transfer transistor 604 and charge storage device 605 (e.g., a floating drain of transfer transistor 604) are implemented, whereas the processing circuits of the pixel cells including buffer 606, quantizer 607, memory 955, etc. are implemented below a front side surface 1012 of second semiconductor substrate 1002*a*. Front side surface 1010 of first semiconductor substrate 1000 may be electrically connected with front side surface 1012 of second semiconductor substrate 1002*a* by vertical interconnects 1004 which include chip-to-chip copper bonding. The chip-to-chip copper bonding can provide pixel interconnects between, for example, the transfer transistor 604 of each pixel cell and the buffer 606 of each pixel cell.

In addition, imaging sensor 800 further includes through silicon vias (TSV) to provide vertical interconnects between pixel cell array 808 and controller 806. The TSVs can be on shoulder regions 1020 and 1022 of the stack and penetrate through second semiconductor substrate 1002*a* and 1002*b*. The TSVs can be configured to transmit, for example, first programming signals 820 and image frames (e.g., first image frames 822). The vertical interconnects can support, for example, transmission of full frame of pixel data (e.g., 1920 pixels×1080 pixels) at the normal frame rate (e.g., 60 frames/second) from pixel cell array 808 to image processor 810 to perform image feature extraction operations.

FIG. 10C illustrates the connection between host processor 804 and image sensor 802.

In the example shown in FIG. 10C, imaging system 800 can include a host processor 804 and multiple image sensors 802, including image sensor 802*a*, 802*b*, 802*n*, etc. Each of image sensor 802 can include a high speed point-to-point connection 1040, such as a MIPI CSI interface, to host processor 804 to transmit image frames. For example, image sensor 802*a* is connected to host processor 804 via point-to-point connection 1040*a*, image sensor 802*b* is connected to host processor 804 via point-to-point connection 1040*b*, whereas image sensor 802*n* is connected to host processor 804 via point-to-point connection 1040*n*. In addition, image sensors 802 and host processor 804 are also connected via a shared system bus, such as an I3C bus, which provides a low rate and low power bus connection for host processor 804 to transmit second programming signals 832 to each of image sensors 802*a*, 802*b*, and 802*n*.

Figure 11:
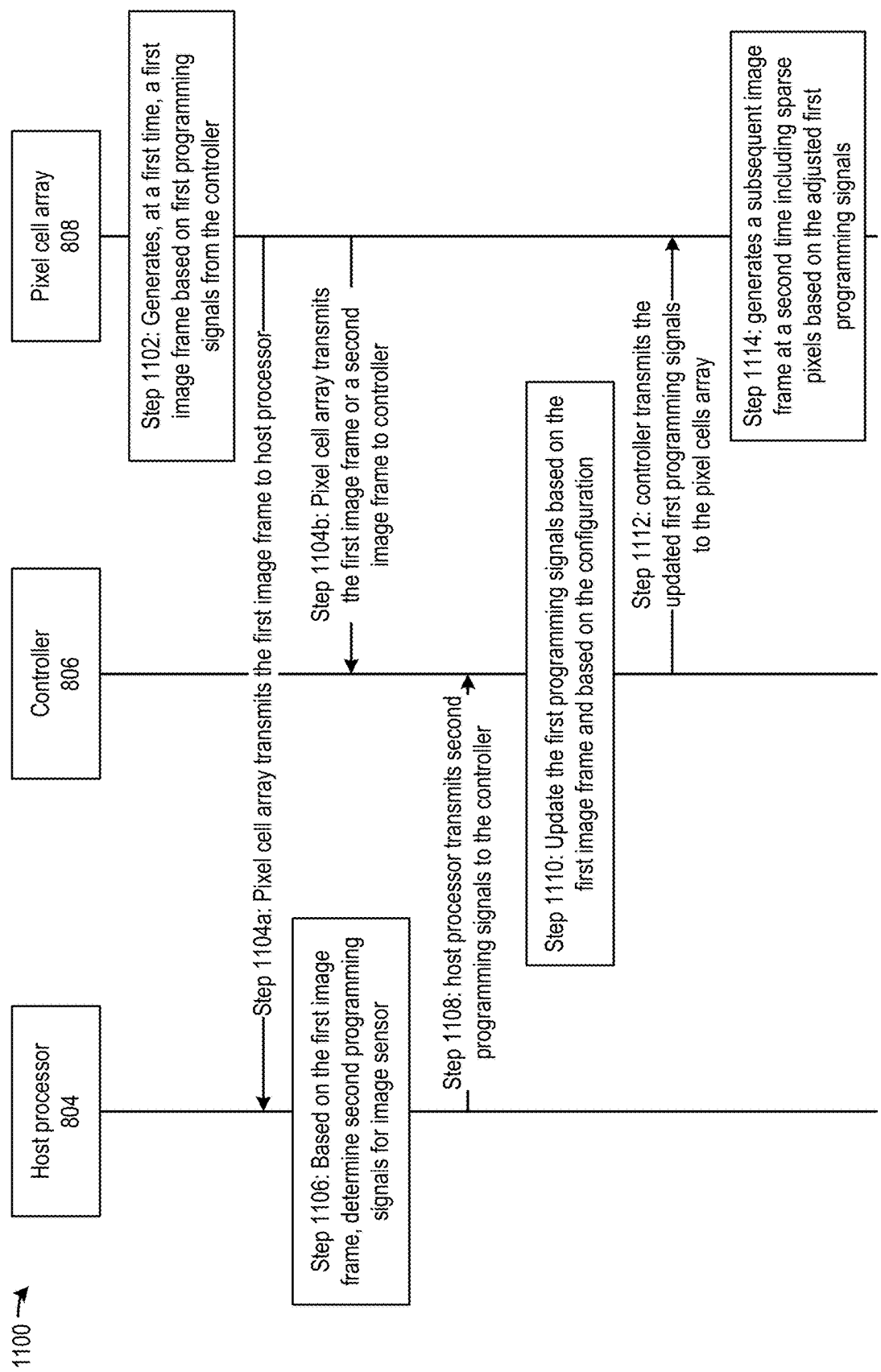
FIG. 11 illustrates a flowchart of an example process for generating image data.

FIG. 11 illustrates a flowchart 1100 of operations of imaging system 800. In step 1102, pixel cell array 808 generates, at a first time, a first image frame 822. The generation of first image frame 822 can be based on first programming signals 820, which may include a programming map, such as pixel array programming map 940 of FIG. 9B. In some examples, first programming signals 820 can indicate that first image frame 822 includes a full frame of pixels. In some examples, first programming signals 820 can indicate that the first image frame has sparse pixels. As part of step 1102, pixel cell array 808 can also generate a second image frame at the first time including a full frame of pixels.

In step 1104*a*, pixel cell array 808 transmits, based on first programming signals 820, the first image frame to host processor via, for example, a point-to-point MIPI CSI interface. The first image frame can have a full frame of pixels or can have sparse pixels.

In step 1104*b*, pixel cell array 808 also transmits the first image frame, or the second image frame, to controller 806.

In step 1106, host processor 804 can determine, based on the first image frame, second programming signals 832, which can include a configuration for image sensor 802. The configuration can be application specific.

In some examples, imaging system 800 may support a DVS operation, such as the DVS operation of FIG. 7D. In such examples, host processor 804 can determine, based on the first image frame, an ambient light intensity of a scene, and determine a threshold for temporal contrast based on the ambient light intensity. For a higher ambient light intensity, the threshold can be set higher, whereas for a lower ambient light intensity, the threshold can be set lower.

Moreover, in a case where imaging system 800 supports an object tracking/detection operation, such as operations shown in FIG. 7A FIG. 7C, host processor 804 can determine, based on the first image frame, one or more ROIs including the object of interest, such as ROI 702 of FIG. 7A, group of pixels 726/728 of FIG. 7B, group of pixels 734 of FIG. 7D, etc. The object of interest can be application specific. For example, the object of interest can include a body part (e.g., eyeball, hand), persons and vehicles in a scene, certain texts/symbols (e.g., QR code) in a scene, an object not to be displayed or have resolution lowered for privacy (e.g., as part of a foveated sampling operation), etc. In such a case, the configuration can indicate, for example, a location, a size, and a shape of each of the one or more ROIs, the coordinates of the objects and their sizes and shapes, etc.

In some examples, image processor 810 of image sensor 802 can include machine-learning model 973, such as a convolutional neural network, to extract features. The weights of the CNN of image sensor 802 can be updated based on an on-line training operation. In a case where host processor 804 is part of the on-line training operation, host processor 804 can determine the backward propagation gradients, based on a training operation involving images received from a single imaging system 800 or multiple imaging systems 800. Host processor 804 can determine the backward propagation gradients as part of the configuration for the image sensor.

The configuration determined in step 1106 can include other parameters, such as a result of evaluation of the feature extraction operation. Host processor 804 can provide the evaluation result as a feedback to influence the feature extraction operation at feature extraction circuit 972. The evaluation result can include, for example, an indication of whether (and/or a percentage of) the sparse pixels output by pixel cell array 808 contain the data needed by the application. As another example, the parameters may include, for example, an estimation of a speed of motion of the object of interest (e.g., based on motion sensor data), a change in the gaze direction, etc. These parameters allow controller 806 to estimate a new location of the ROI in a subsequent image frame.

In step 1108, host processor 804 can transmit the configuration as part of second programming signals 832 to controller 806. The transmission of the configuration can be via, for example, a shared bus interface such as I3C bus.

In step 1110, controller 806 can update the first programming signals 820 based on the first image frame and based on the configuration. The updating can be application specific as well.

For example, in a case where a DVS operation is being performed, image processor 810 can determine differences in pixel values between the first image frame and a prior image frame, and the compare the differences against the threshold included in the configuration to identify pixels for which the temporal contrast exceeds the threshold. Programming map generator 812 can then update the pixel array programming map to activate only the pixels for which the temporal contrast exceeds the threshold, and/or to select those pixels to output pixel values at a higher resolution.

Moreover, in a case where imaging system 800 supports an object tracking/detection operation, image processor 810 can perform a feature extraction operation on the first image data frame to identify the precise location of the object. The feature extraction operation can be based on the configuration information transmitted by host processor 804 in step 1108. For example, the configuration information can include weights of a CNN, backward propagation gradients for updating the weights of a CNN as part of the on-line training, initial estimates of coordinates of the ROIs, the speed of motion of the object of interest, a change in the gaze direction, etc.

Imaging system 800 can then estimate a location of the ROI in a subsequent image frame to be captured based on the configuration information, and update the programming map to reflect the estimated location of the ROI in the subsequent image frame.

In step 1112, controller 806 can transmit the updated first programming signals 820 to pixel cell array 808. Pixel cell array 808 can then generate, at a second time, the subsequent image frame including sparse pixels based on the updated programming map, in step 1114.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer-readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An apparatus comprising:
a pixel cell array, each pixel cell in the pixel cell array including a photodiode and processing circuits, the photodiodes being formed in a first semiconductor substrate and the processing circuits formed in one or more second semiconductor substrates; and
a controller formed in at least one of the one or more second semiconductor substrates, the first semiconductor substrate and the one or more second semiconductor substrates forming a stack and housed within a semiconductor package;
wherein the pixel cell array is configured to:
 capture pixel data at a first time;
 generate, based on the pixel data and first programming signals received from the controller, a first image frame, the first programming signals identifying a first plurality of pixels in the pixel cell array;
 generate a second image frame based on the pixel data and second programming signals, the second programming signals identifying a second plurality of pixels in the pixel cell array and having a different sparsity of pixels from the first image frame;
 transmit the first image to a host processor; and
 transmit the first image frame or the second image frame to the controller; and
wherein the controller is configured to:
 receive the first image frame or the second image frame from the pixel cell array;
 receive updated programming signals from the host processor, the updated programming signals being determined by the host processor based on the first image frame;
 update the second programming signals based on the updated programming signals; and
 control the pixel cell array to:
  capture second pixel data at a second time; and
  generate subsequent first and second image frames at the second time, the subsequent second image frame based on the updated second programming signals.

2. The apparatus of claim 1, further comprising the host processor;
wherein the controller is further configured to update the first programming signals based on the first image frame or the second image frame and at a frame rate at which the pixel cell array generates image frames; and
wherein the host processor is configured to update the second programming signals at a rate lower than the frame rate.

3. The apparatus of claim 1, wherein the first programming signals comprise a first subset of the first programming signals identifying a first subset of pixel cells of the pixel cell array and a second subset of first programming signals identifying at a second subset of pixel cells of the pixel cell array; and
wherein the controller is further configured to update the first subset of pixel cells identified by the first subset of the first programming signals, and update the second subset of pixel cells identified by the second subset of the first programming signals.

4. The apparatus of claim 3, wherein the first subset of the first programming signals control the first subset of pixel cells to output pixel data at a first resolution to the host processor; and
wherein the second subset of the first programming signals control the second subset of pixel cells not to output pixel data, or to output pixel data at a second resolution lower than the first resolution, to the host processor.

5. The apparatus of claim 1, wherein the controller is further configured to:
perform, based on the second programming signals, an image processing operation on the first image frame or the second image frame to generate a processing result; and
update the first programming signals based on the processing result.

6. The apparatus of claim 5, wherein the image processing operation comprises:
determining, for each pixel included in the first image frame or the second image frame, a pixel value difference with respect to a corresponding pixel in a third image frame generated by the pixel cell array prior to the first time; and
identifying a subset of pixels in the first image frame or the second image frame for which the pixel value differences exceed a threshold;
wherein the controller is further configured to update the second programming signals based on identifying a subset of pixel cells of the pixel cell array, the subset of pixel cells being identified based on the subset of pixels; and
wherein the controller-updated second programming signals define the threshold.

7. The apparatus of claim 6, further comprising the host processor,
wherein the host processor is configured to set the threshold based on determining an ambient light intensity from the first image frame.

8. The apparatus of claim 5, wherein the image processing operation comprises identifying a subset of pixels in the first image frame or in the second image frame that include target features of an object of interest;
wherein the controller is further configured to update the second programming signals based on identifying a subset of pixel cells of the pixel cell array, the subset of pixel cells being identified based on the subset of pixels; and
wherein the controller-updated second programming signals include information about the target features.

9. The apparatus of claim 8, wherein the second programming signals indicate an initial subset of pixels in the first image frame that include the target features; and
wherein the image processing operation comprises identifying the subset of pixels based on determining whether the initial subset of pixels in the first image frame or in the second image frame include the target features of the object of interest.

10. The apparatus of claim 8, wherein the controller is further configured to:
based on information about a movement of the object of interest and a time difference between the first time and the second time, determine the subset of pixels in the subsequent second image frame that include the target features; and
update the second programming signals based on determining a subset of pixel cells of the pixel cell array based on the subset of pixels in the subsequent second image frame; and
wherein the controller-updated second programming signals include the information about the movement of the object of interest.

11. The apparatus of claim 8, wherein the second programming signals indicate that an initial subset of the pixels in the first image frame, defined based on the first programming signals, do not include all the target features; and
wherein the image processing operation comprises, based on the second programming signals, identifying additional pixels that include the target features.

12. The apparatus of claim 8, wherein the controller includes a neural network model to perform the image processing operation; and
wherein the second programming signals include at least one of: weights of the neural network model, backward propagation gradients to update the weights, a predicted accuracy of image processing operation, or intermediate outputs from the image processing operation.

13. The apparatus of claim 1, wherein each pixel cell of the pixel cell array or each block of pixel cells of the pixel cell array is individually addressable; and
wherein the first programming signals comprise pixel-level signals individually targeted at each pixel cell or block-level signals targeted at each block of pixel cells.

14. The apparatus of claim 1, further comprising:
pixel interconnects implemented by chip-to-chip copper bonding between the first semiconductor substrate and the one or more second semiconductor substrates to transmit signals generated by the photodiodes in the first semiconductor substrate to the processing circuits of pixel cell array in the one or more second semiconductor substrates; and
through silicon vias (TSV) between the first semiconductor substrate and the one or more second semiconductor substrates to transmit the image frames from the pixel cell array to the controller, and to transmit the first programming signals from the controller to the pixel cell array.

15. The apparatus of claim 1, wherein the pixel cell array is coupled with the host processor via a point-to-point serial interface and is configured to transmit the image frames to the host processor via the point-to-point serial interface.

16. The apparatus of claim 1, wherein the controller is coupled with the host processor via a shared bus interface, the shared bus interface further coupled with other controllers; and
wherein the controller is configured to receive the updated second programming signals from the host processor via the shared bus interface.

17. A method, comprising:
capturing, via a pixel cell array, pixel data at a first time;
controlling the pixel cell array to generate a first image frame based on the pixel data and first programming signals, the first programming signals identifying a first plurality of pixels in the pixel cell array, and to transmit the first image frame to a host processor;
generating a second image frame based on the pixel data and second programming signals, the second programming signals identifying a second plurality of pixels in the pixel cell array, and having a different sparsity of pixels from the first image frame;
receiving, from the pixel cell array, the first image frame or the second image frame from the pixel cell array;
receiving updated programming signals from the host processor, the updated programming signals being determined by the host processor based on the first image frame;
updating the second programming signals based on the updated programming signals and the first image frame or the second image frame received from the pixel cell array; and controlling the pixel cell array to:
    capture second pixel data at a second time; and
    generate subsequent first and second image frames at the second time, the subsequent second image frame based on the updated second programming signals.

18. The method of claim 17, further comprising:
performing, based on the second programming signals, an image processing operation on the first image frame or the second image frame to generate a processing result; and
updating the first programming signals based on the processing result.

19. The method of claim 18, wherein the image processing operation comprises identifying a subset of pixels in the first image frame or in the second image frame that include target features of an object of interest;
    wherein the first programming signals are updated based on identifying the subset of pixel cells; and
    wherein the second programming signals include information about the target features.

20. The method of claim 17, wherein the pixel cell array transmits the first image frame to the host processor via a point-to-point serial interface; and
    wherein the second programming signals are received via a shared bus interface.

* * * * *